US010181526B2

(12) United States Patent
Cantoro et al.

(10) Patent No.: US 10,181,526 B2
(45) Date of Patent: Jan. 15, 2019

(54) FIELD EFFECT TRANSISTOR INCLUDING MULTIPLE ASPECT RATIO TRAPPING STRUCTURES

(71) Applicants: Mirco Cantoro, Suwon-si (KR); Yeoncheol Heo, Suwon-si (KR)

(72) Inventors: Mirco Cantoro, Suwon-si (KR); Yeoncheol Heo, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/602,593

(22) Filed: May 23, 2017

(65) Prior Publication Data

US 2017/0352761 A1 Dec. 7, 2017

(30) Foreign Application Priority Data

Jun. 2, 2016 (KR) .................. 10-2016-0068928
Nov. 3, 2016 (KR) .................. 10-2016-0145958

(51) Int. Cl.
*H01L 29/417* (2006.01)
*H01L 29/78* (2006.01)
*H01L 29/06* (2006.01)
*H01L 27/088* (2006.01)
*H01L 29/10* (2006.01)
*H01L 29/66* (2006.01)

(52) U.S. Cl.
CPC ...... *H01L 29/7849* (2013.01); *H01L 27/0886* (2013.01); *H01L 29/0657* (2013.01); *H01L 29/1054* (2013.01); *H01L 29/41791* (2013.01); *H01L 29/66545* (2013.01); *H01L 29/785* (2013.01)

(58) Field of Classification Search
CPC ............. H01L 29/7849; H01L 27/0886; H01L 29/0649; H01L 29/0657; H01L 29/1054; H01L 29/41791; H01L 29/785; H01L 27/0924; H01L 29/36; H01L 29/16; H01L 29/66795; H01L 21/823431; H01L 21/845; H01L 28/10826; H01L 27/10879
USPC ......... 257/288, 368, 369; 438/151, 197, 199
See application file for complete search history.

(56) References Cited

U.S. PATENT DOCUMENTS

| | | | |
|---|---|---|---|
| 8,173,551 B2 | 5/2012 | Bai et al. | |
| 8,785,907 B2 | 7/2014 | Goel et al. | |
| 8,937,299 B2 | 1/2015 | Basu et al. | |
| 9,029,246 B2 | 5/2015 | Chen et al. | |
| 9,064,699 B2 | 6/2015 | Wang et al. | |
| 9,159,554 B2 | 10/2015 | Sanchez et al. | |

(Continued)

FOREIGN PATENT DOCUMENTS

KR 1020157031818 5/2015

*Primary Examiner* — Shahed Ahmed
(74) *Attorney, Agent, or Firm* — Ward and Smith, P.A.

(57) ABSTRACT

The present disclosure relates to a field-effect transistor and a method of fabricating the same. A field-effect transistor includes a semiconductor substrate including a first semiconductor material having a first lattice constant, and a fin structure on the semiconductor substrate. The fin structure includes a second semiconductor material having a second lattice constant that is different from the first lattice constant. The fin structure further includes a lower portion that is elongated in a first direction, a plurality of upper portions protruding from the lower portion and elongated in a second direction that is different from the first direction, and a gate structure crossing the plurality of upper portions.

18 Claims, 50 Drawing Sheets

(56) References Cited

U.S. PATENT DOCUMENTS

| | | |
|---|---|---|
| 9,224,605 B2 | 12/2015 | Qi et al. |
| 9,443,940 B1 * | 9/2016 | Fogel .................... H01L 29/32 |
| 2013/0233238 A1 | 9/2013 | Vincent et al. |
| 2015/0171187 A1 * | 6/2015 | Huang ............. H01L 29/66545 438/283 |
| 2015/0249087 A1 * | 9/2015 | Cantoro ............. H01L 27/0924 257/369 |
| 2016/0056244 A1 | 2/2016 | Dasgupta et al. |

* cited by examiner

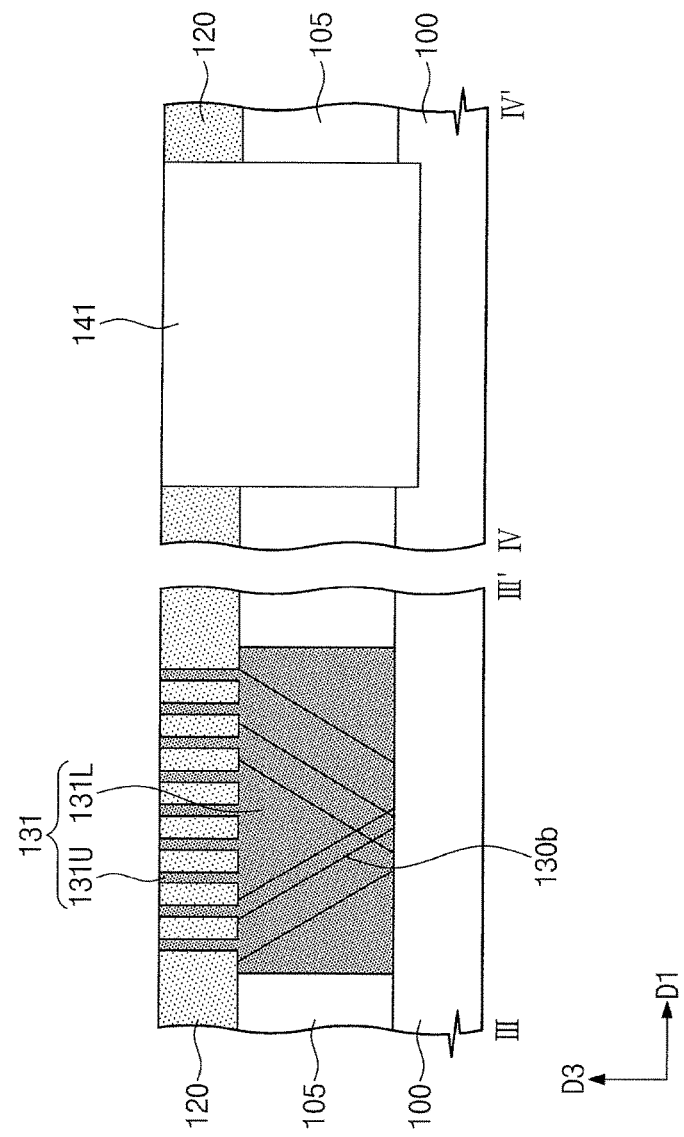

FIELD EFFECT TRANSISTOR INCLUDING MULTIPLE ASPECT RATIO TRAPPING STRUCTURES

CROSS-REFERENCE TO RELATED APPLICATIONS

This U.S. non-provisional patent application claims priority under 35 U.S.C. § 119 to Korean Patent Application No. 10-2016-0068928, filed on Jun. 2, 2016 and Korean Patent Application No. 10-2016-0145958, filed on Nov. 3, 2016, in the Korean Intellectual Property Office, the disclosure of which is hereby incorporated herein by reference.

BACKGROUND

The present disclosure relates to semiconductor devices, and in particular, to field-effect transistors.

A semiconductor device may include an integrated circuit (IC) composed of a plurality of metal oxide semiconductor field-effect transistors (MOSFETs). To increase the integration density of such devices, it is desirable to reduce a size and a design rule of the semiconductor device. This may require a scaling-down of MOS transistors. However, such a scaling-down of MOS transistors may lead to degradation in operational characteristics of the semiconductor device. Accordingly, research is being conducted on various techniques aimed at fabricating highly integrated semiconductor devices that offer better performance. In particular, in order to realize high-performance MOS devices, a technology for increasing mobility of carriers (electrons or holes) is being intensively researched.

SUMMARY

Some embodiments of the inventive concept provide a field-effect transistor with a reduced area and improved electric characteristics.

Some embodiments of the inventive concept provide a method of fabricating a field-effect transistor with a reduced area and improved electric characteristics.

According to some embodiments of the inventive concepts, a field-effect transistor includes a semiconductor substrate including a first semiconductor material having a first lattice constant, and a fin structure on the semiconductor substrate. The fin structure includes a second semiconductor material having a second lattice constant that is different from the first lattice constant. The fin structure further includes a lower portion that is elongated in a first direction, a plurality of upper portions protruding from the lower portion and elongated in a second direction that is different from the first direction, and a gate structure crossing the plurality of upper portions.

According to some embodiments of the inventive concepts, a field-effect transistor may include a semiconductor substrate including a first semiconductor material, plurality of fin structures including a second semiconductor material on the semiconductor substrate, a plurality of gate electrodes extending parallel to the lower portions of the fin structures and crossing the upper portions of the fin structures, and source/drain regions in the upper portions of the fin structures on opposite sides of the gate electrodes. The second semiconductor material is different from the first semiconductor material, and the fin structures are spaced apart from each other. Each of the fin structures includes a lower portion that is elongated in a first direction and a plurality of upper portions protruding from the lower portion and crossing the lower portion in a second direction that is different from the first direction.

According to some embodiments of the inventive concepts, a method of fabricating a field-effect transistor may include forming a device isolation layer, the device isolation layer including a lower trench that extends in a first direction and exposes a portion of a semiconductor substrate, forming a mask pattern on the device isolation layer, the mask pattern having a plurality of upper trenches crossing the lower trench and extending in a second direction that is different from the first direction, and forming an epitaxial layer in the lower trench and the upper trenches, wherein the epitaxial layer includes a semiconductor material having a lattice constant is different from that of the semiconductor substrate, and wherein the epitaxial layer includes a lower portion in the lower trench and upper portions in the upper trenches.

According to some embodiments of the inventive concepts, a semiconductor structure includes a semiconductor substrate including a first semiconductor material having a first lattice constant, and an epitaxial structure on the semiconductor substrate, the epitaxial structure including a second semiconductor material having a second lattice constant that is different from the first lattice constant. The epitaxial structure includes a lower portion that is elongated in a first direction, and an upper portion on the lower portion and elongated in a second direction that is different from the first direction, wherein the upper portion extends in the second direction past sidewalls of the lower portion.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 1A to 10A are plan views illustrating a method of fabricating a semiconductor device, according to some embodiments of the inventive concepts.

FIGS. 1B to 10B are sectional views taken along lines I-I' and II-II' of FIGS. 1A to 10A, respectively.

FIGS. 1C to 10C are sectional views taken along lines III-III' and IV-IV' of FIGS. 1A to 10A, respectively.

FIGS. 18A to 22A and FIGS. 18B to 22B are sectional views illustrating a method of fabricating a semiconductor device, according to some embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

FIGS. 1A to 10A are plan views illustrating a method of fabricating a semiconductor device, according to some embodiments of the inventive concepts. FIGS. 1B to 10B are sectional views taken along lines I-I' and II-II' of FIGS. 1A to 10A, respectively. FIGS. 1C to 10C are sectional views taken along lines III-III' and IV-IV' of FIGS. 1A to 10A, respectively.

Figure 10A:
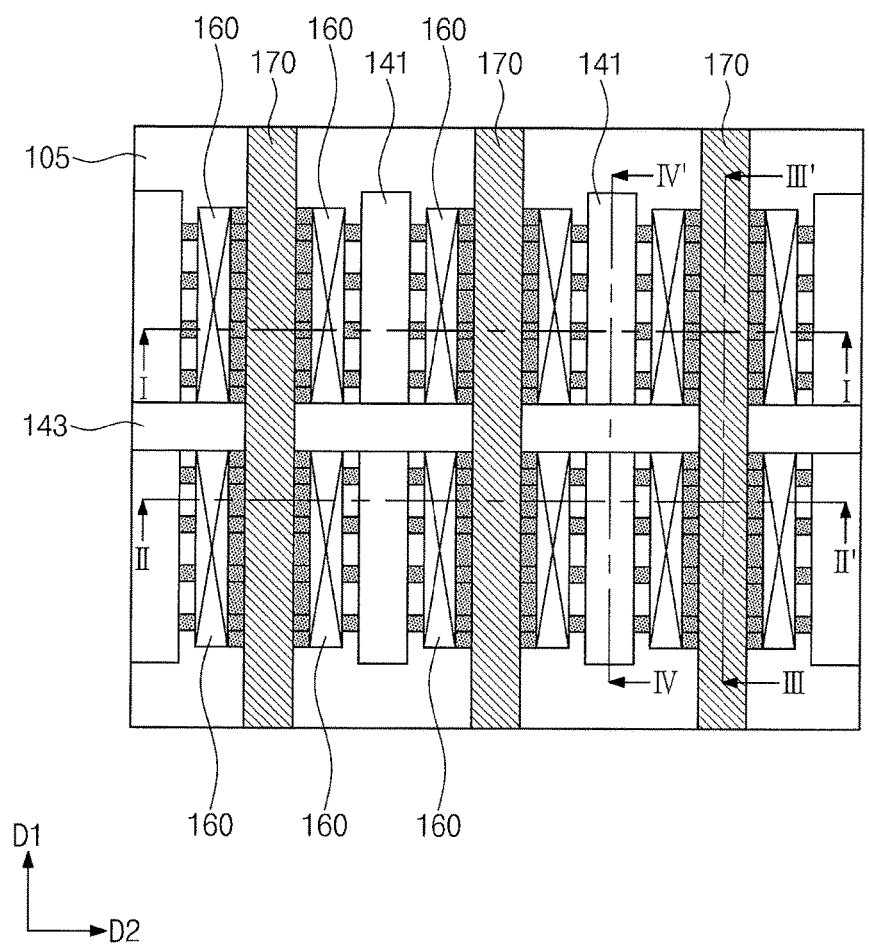
Figure 11A:
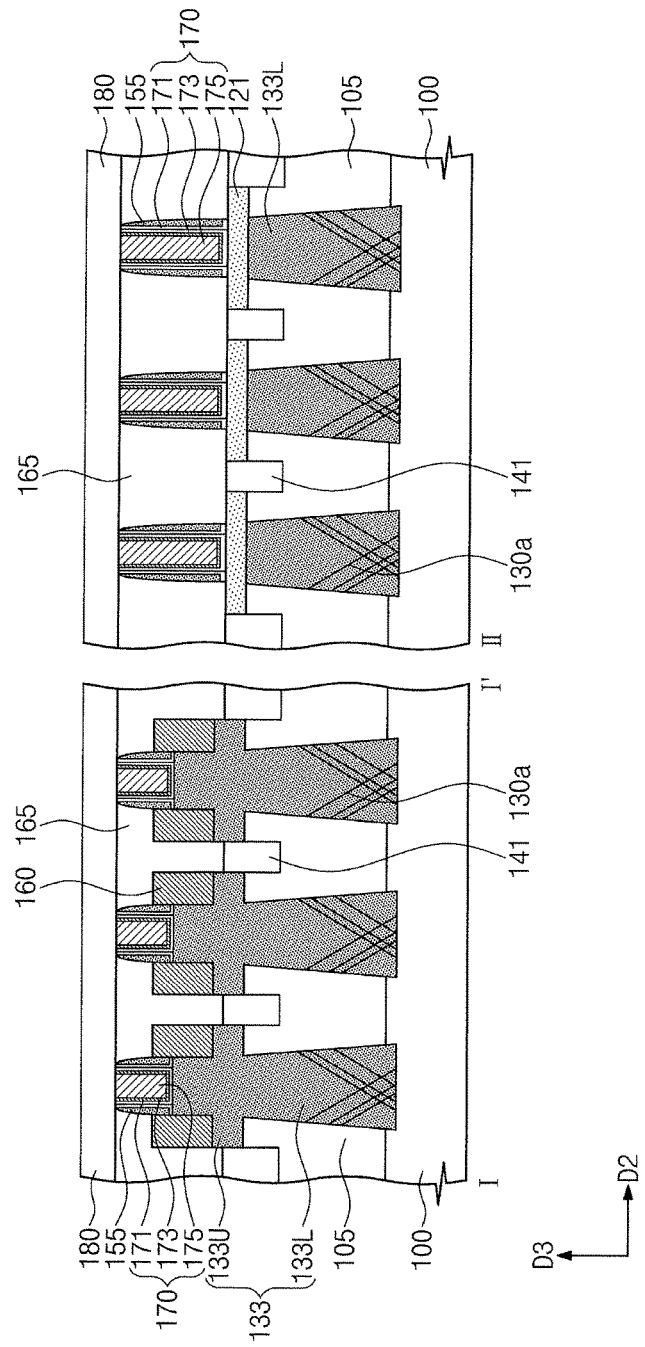
FIGS. 11A and 11B are sectional views of semiconductor devices according to some embodiments of the inventive concepts.
Figure 11B:
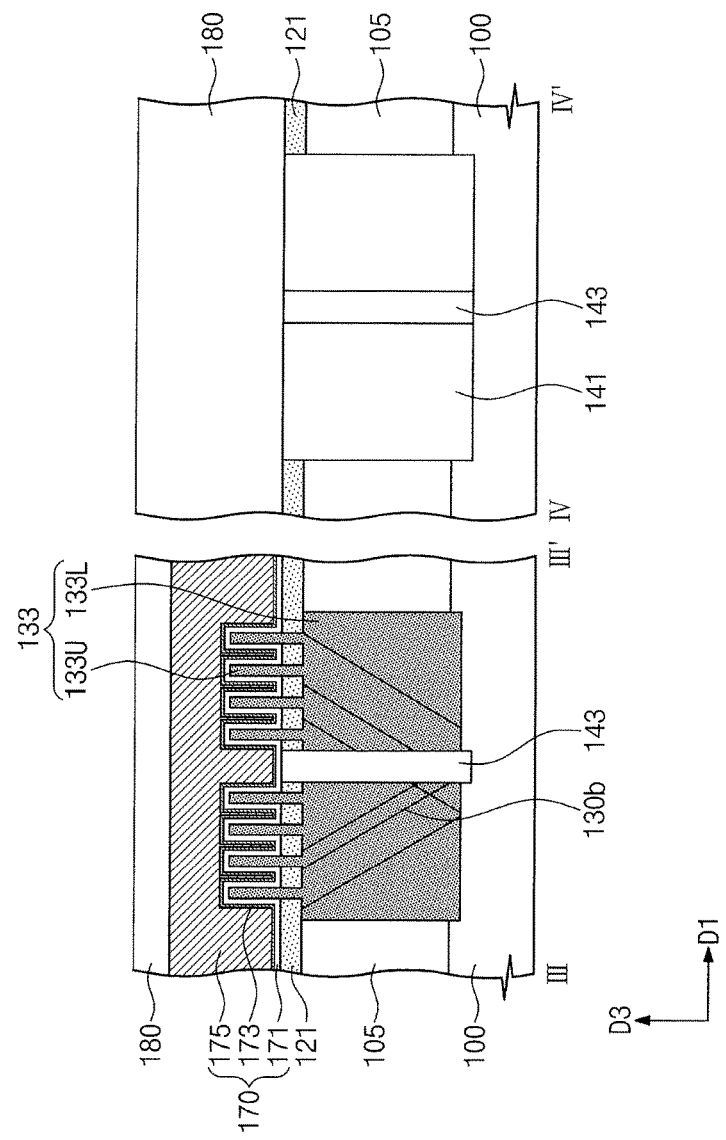

FIGS. 11A and 11B are sectional views of semiconductor devices according to some embodiments of the inventive concepts. For example, FIG. 11A is a sectional view taken along lines I-I' and II-II' of FIG. 10A, and FIG. 11B is a sectional view taken along lines and IV-IV' of FIG. 10A.

Figure 1A:
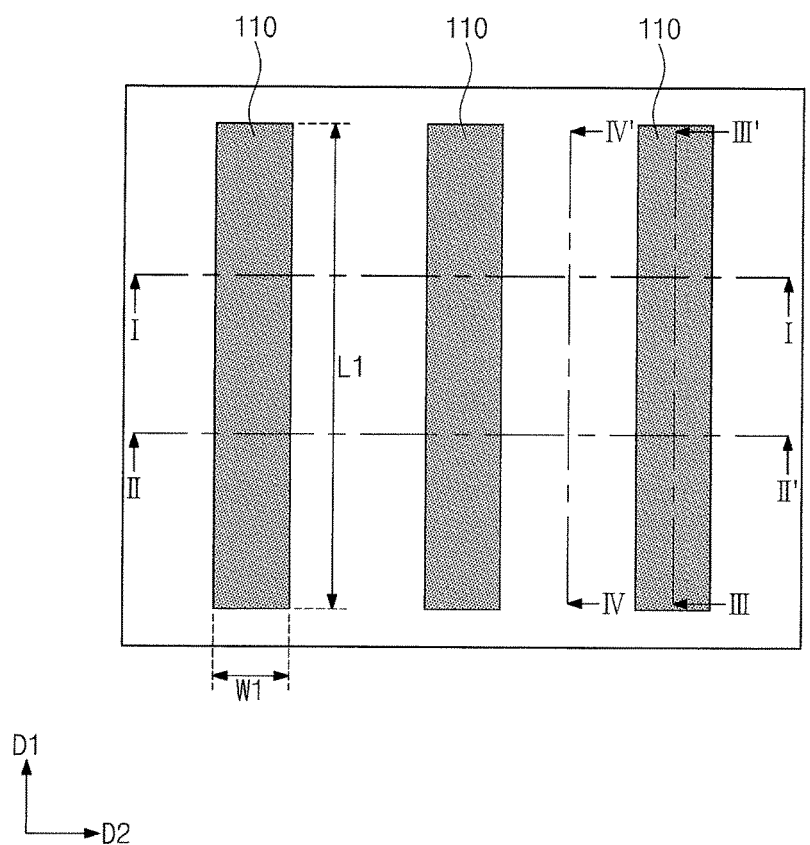
Figure 1B:
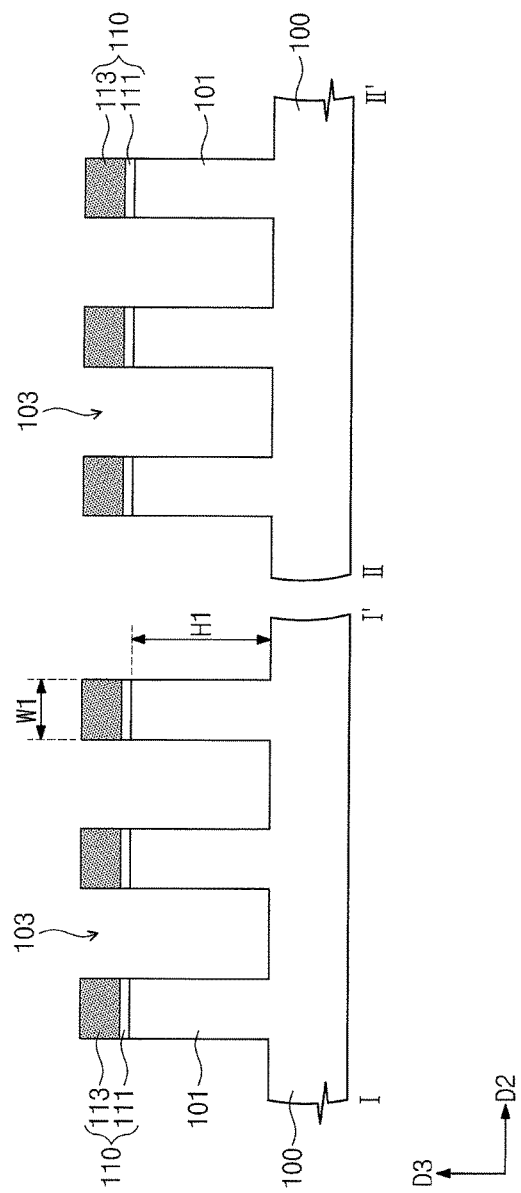
Figure 1C:
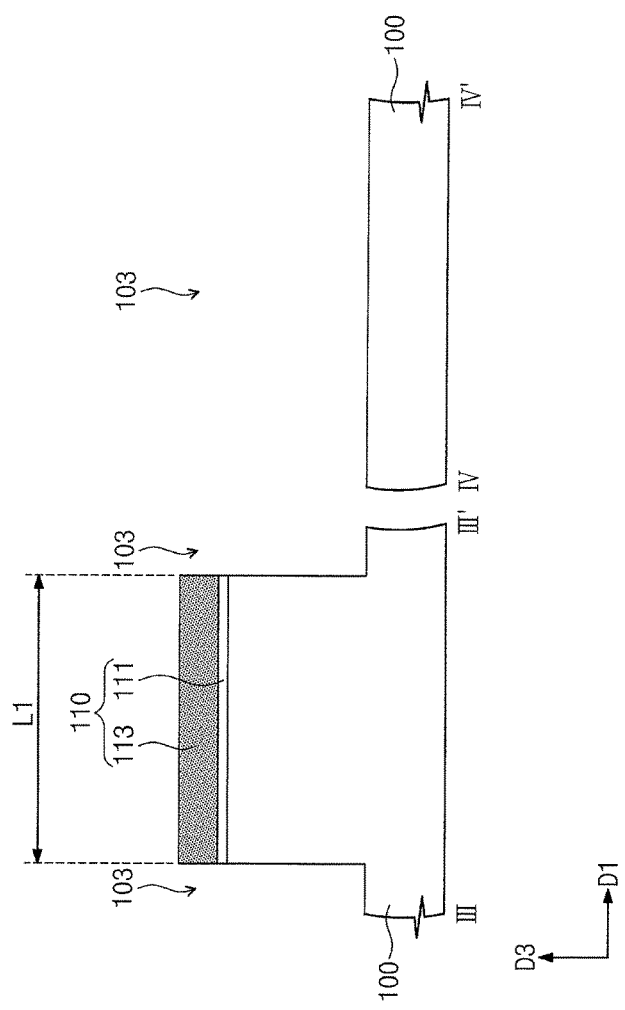

Referring to FIGS. 1A, 1B, and IC, a semiconductor substrate 100 may be patterned to form a device isolation trench 103 defining preliminary active patterns 101.

The semiconductor substrate 100 may be formed of or include a semiconductor material (e.g., at least one of silicon (Si), germanium (Ge), silicon germanium (SiGe), gallium arsenide (GaAs), indium gallium arsenide (InGaAs), or aluminum gallium arsenide (AlGaAs)).

In some embodiments, the semiconductor substrate 100 may be a bulk silicon substrate, a silicon-on-insulator (SOI) substrate, a germanium substrate, a germanium-on-insulator (GOI) substrate, a silicon-germanium substrate, or a substrate with a layer epitaxially grown by a selective epitaxial growth (SEG) technique. In certain embodiments, the semiconductor substrate 100 may be a III-V compound semiconductor substrate.

In some embodiments, the semiconductor substrate 100 may be a single-crystalline silicon substrate, and a top surface of the semiconductor substrate 100 may have a crystal plane of (100) or (110).

In some embodiments, the formation of the device isolation trench 103 may include forming a first mask pattern 110 on the semiconductor substrate 100 to expose some regions of the semiconductor substrate 100, and then, anisotropically etching the semiconductor substrate 100 using the first mask pattern 110 as an etch mask to define the preliminary active patterns 101.

The first mask pattern 110 may be a line-shaped structure extending in a first direction D1 and may include a buffer oxide pattern 111 and a hard mask pattern 113 that are sequentially stacked. In detail, the formation of the first mask pattern 110 may include sequentially stacking a silicon oxide layer and a hard mask layer on the semiconductor substrate 100, forming a photoresist pattern (not shown) on the hard mask layer to define the preliminary active patterns 101, and sequentially and anisotropically etching the hard mask layer and the silicon oxide layer using the photoresist pattern (not shown) as an etch mask to expose the top surface of the semiconductor substrate 100. The silicon oxide layer may be formed by performing a thermal oxidation process on the semiconductor substrate 100. The hard mask layer may be formed of one of silicon nitride, silicon oxynitride, and polycrystalline silicon. The hard mask layer may be thicker than the silicon oxide layer. A thickness of the hard mask layer may be adjusted, depending on a depth of the device isolation trench 103 in the semiconductor substrate 100. In some embodiments, the first mask pattern may be removed after the formation of the trench or after the formation of a device isolation layer 105.

In some embodiments, the preliminary active patterns 101 may be formed as line-shaped structures extending in the first direction D1, and may be spaced apart from each other in a second direction D2 that is perpendicular to the first direction D1. As an example, a spacing between the preliminary active patterns 101 may be greater than a width W1 of the preliminary active patterns 101. The preliminary active patterns 101 may have a width that increases in a downward direction.

The device isolation trench 103 may have a sidewall that is substantially perpendicular or inclined to the top surface of the semiconductor substrate 100. A depth H1 of the device isolation trench 103 may be greater than two times the width W1 of the preliminary active patterns 101. The depth H1 of the device isolation trench may be smaller than a length L1 of the preliminary active pattern 101 in the first direction D1.

Figure 2A:
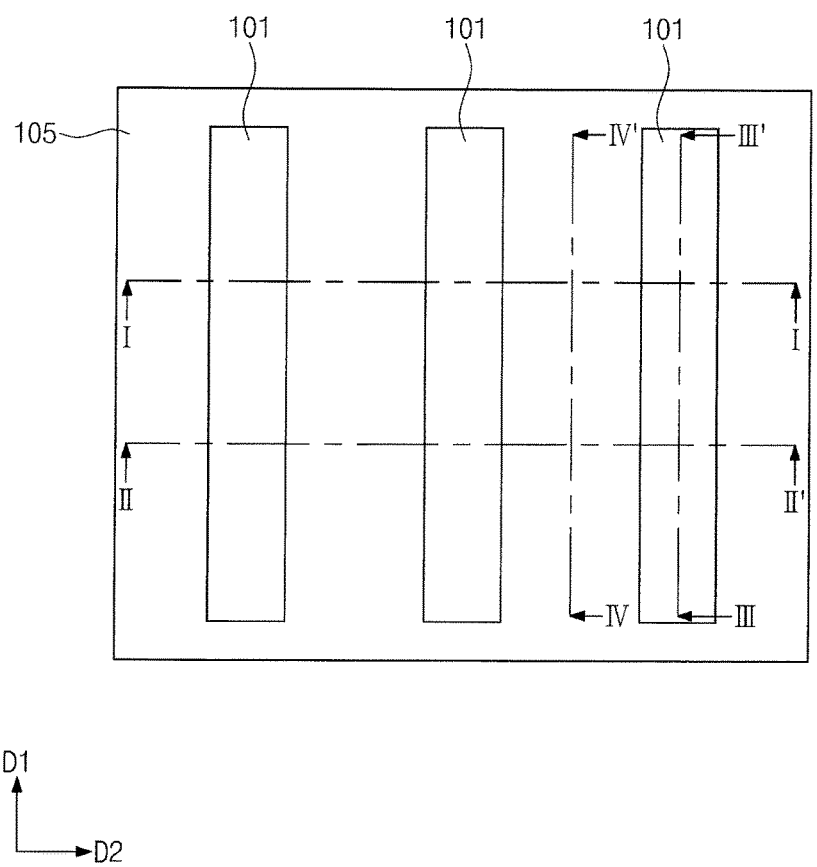
Figure 2B:
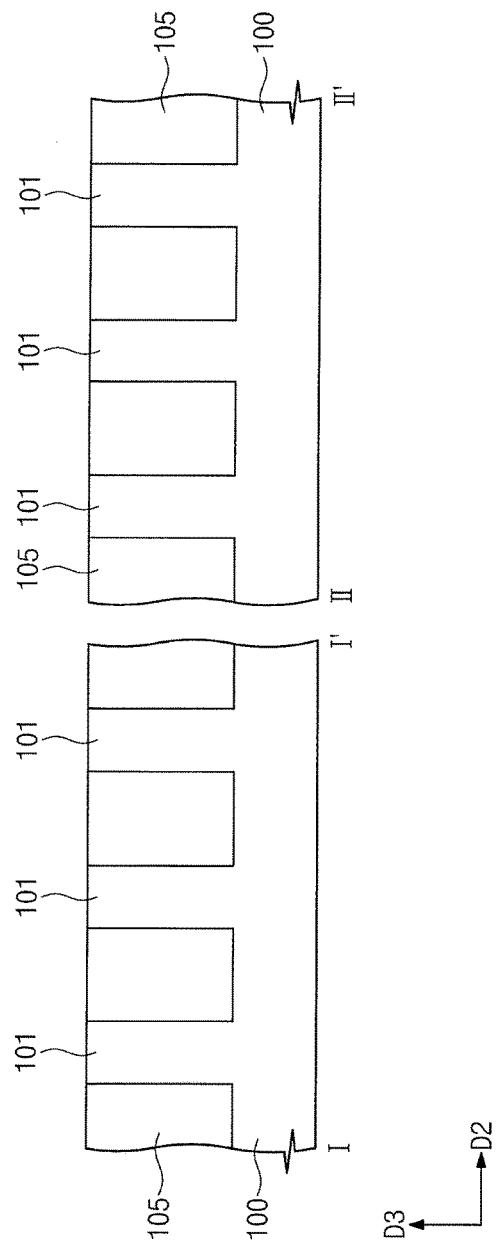
Figure 2C:
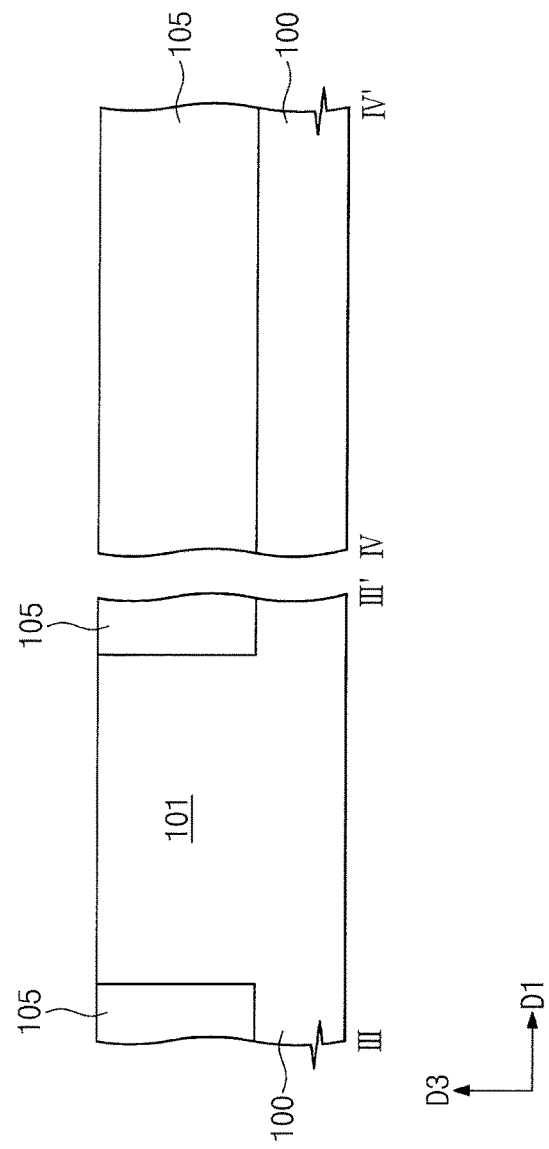

Referring to FIGS. 2A, 2B, and 2C, a device isolation layer 105 may be formed in the device isolation trench 103. The device isolation layer 105 may be formed to cover both sidewalls of the preliminary active patterns 101.

The formation of the device isolation layer 105 may include forming an insulating layer to fill the device isolation trench 103 and planarizing the insulating layer to expose top surfaces of the preliminary active patterns 101. An insulating material filling the device isolation trench 103 may be deposited using a deposition technique with a good step coverage property. For example, the insulating layer may be deposited using an atomic layer deposition (ALD) method, a chemical vapor deposition (CVD) method, and/or a plasma-enhanced chemical vapor deposition (PE-CVD) method. Also, the insulating layer may be formed of or include an insulating material with an excellent gap-filling property (e.g., a boron-phosphor silicate glass (BPSG) layer, a high density plasma (HDP) oxide layer, an undoped silicate glass (USG) layer, or Tonen SilaZene (TOSZ)). The planarization process on the insulating layer may be performed using an etch-back method and/or a chemical mechanical polishing (CMP) method.

The device isolation layer 105 may have a sidewall that is substantially perpendicular to the top surface of the semiconductor substrate 100 or that is inclined to the top surface of the semiconductor substrate 100, as shown in FIGS. 11A and 11B.

In some embodiments, as described above, the device isolation layer 105 may be formed in the semiconductor substrate 100, but the inventive concepts are not limited thereto. For example, the device isolation layer 105 may be formed on the top surface of the semiconductor substrate 100 to expose some regions of the semiconductor substrate 100.

Figure 3A:
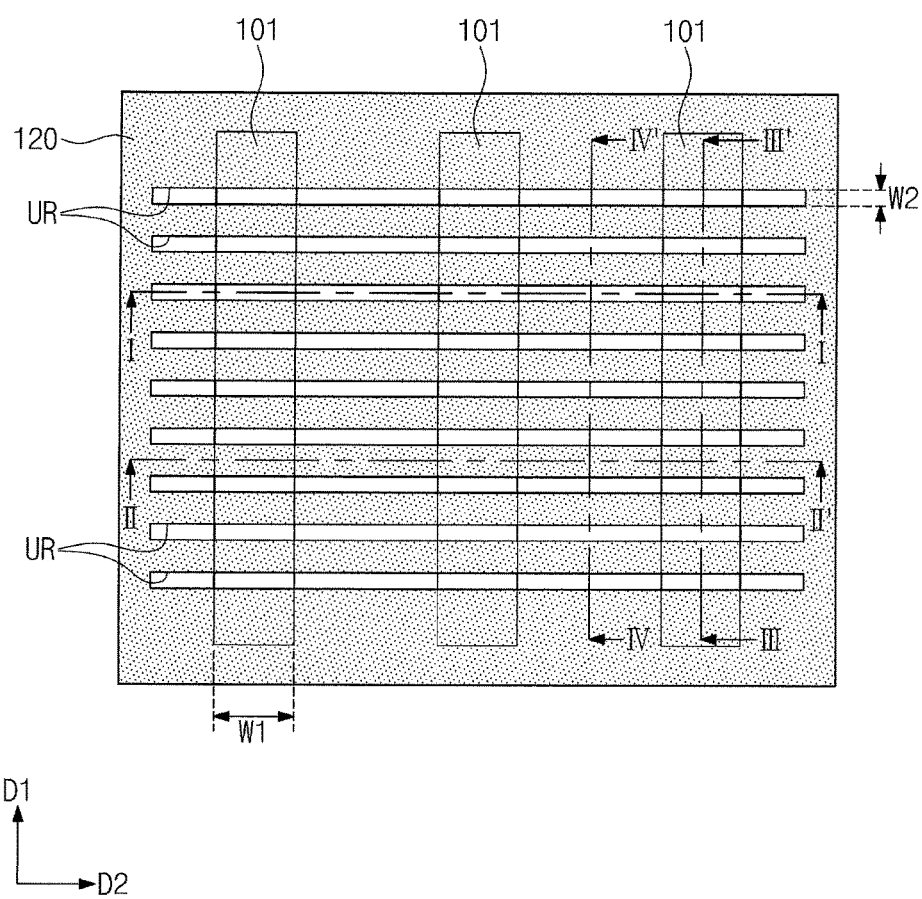
Figure 3B:
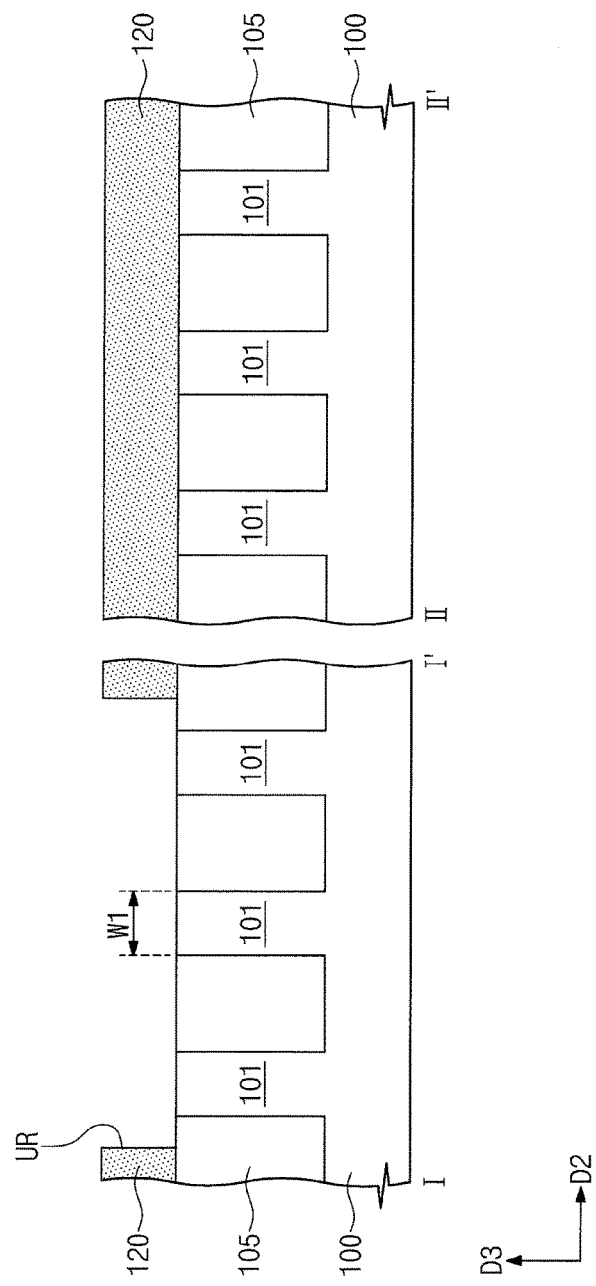
Figure 3C:
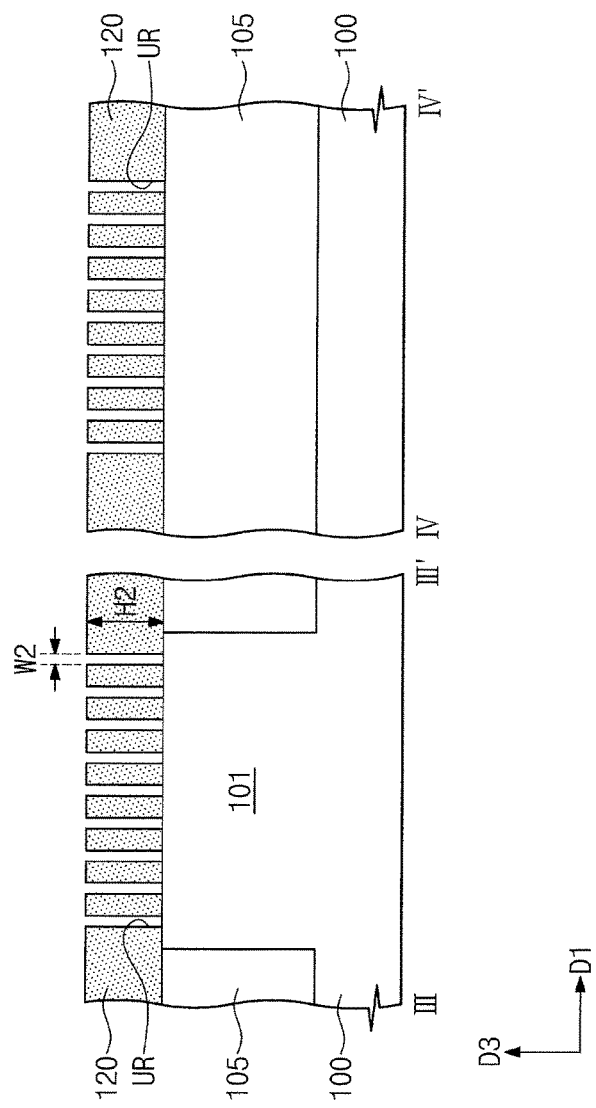

Referring to FIGS. 3A, 3B, and 3C, a second mask pattern 120, which includes upper trenches UR crossing the preliminary active patterns 101, may be formed.

The formation of the second mask pattern 120 may include depositing a hard mask layer to cover the semiconductor substrate 100, forming a line-shaped photoresist pattern (not shown), which extends in the second direction D2 perpendicular to the first direction D1, on the hard mask layer, and anisotropically etching the hard mask layer using the photoresist pattern (not shown) as an etch mask to expose the top surface of the semiconductor substrate 100. In some embodiments, the second mask pattern 120 may be formed of an insulating material having an etch selectivity with respect to the semiconductor substrate 100 and the device isolation layer 105. The second mask pattern 120 may be formed of, for example, a silicon nitride layer or a silicon oxynitride layer.

In some embodiments, the upper trenches UR may be formed to partially expose the preliminary active patterns 101. In some embodiments, the upper trenches UR may be formed to extend in a direction that is perpendicular to the preliminary active patterns 101, as illustrated in FIG. 3A. Moreover, each of the upper trenches UR may cross over a plurality of the preliminary active patterns 101. The upper trenches UR may have a width W2 that is smaller than the width W1 of the preliminary active patterns 101. For example, the width W2 of the upper trenches UR may be selected to be within a range from about 5 nm to about 50 nm. A thickness H2 of the second mask pattern 120 (i.e., a height of the upper trenches UR) may be greater than two times the width W2 of the upper trenches UR.

Figure 4A:
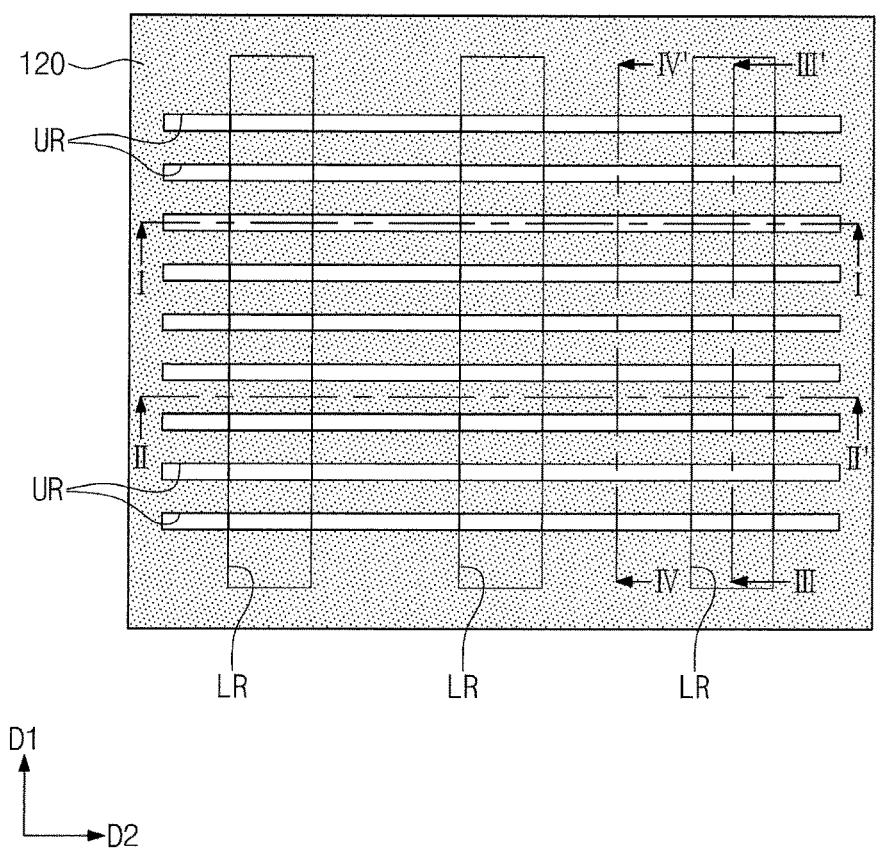
Figure 4B:
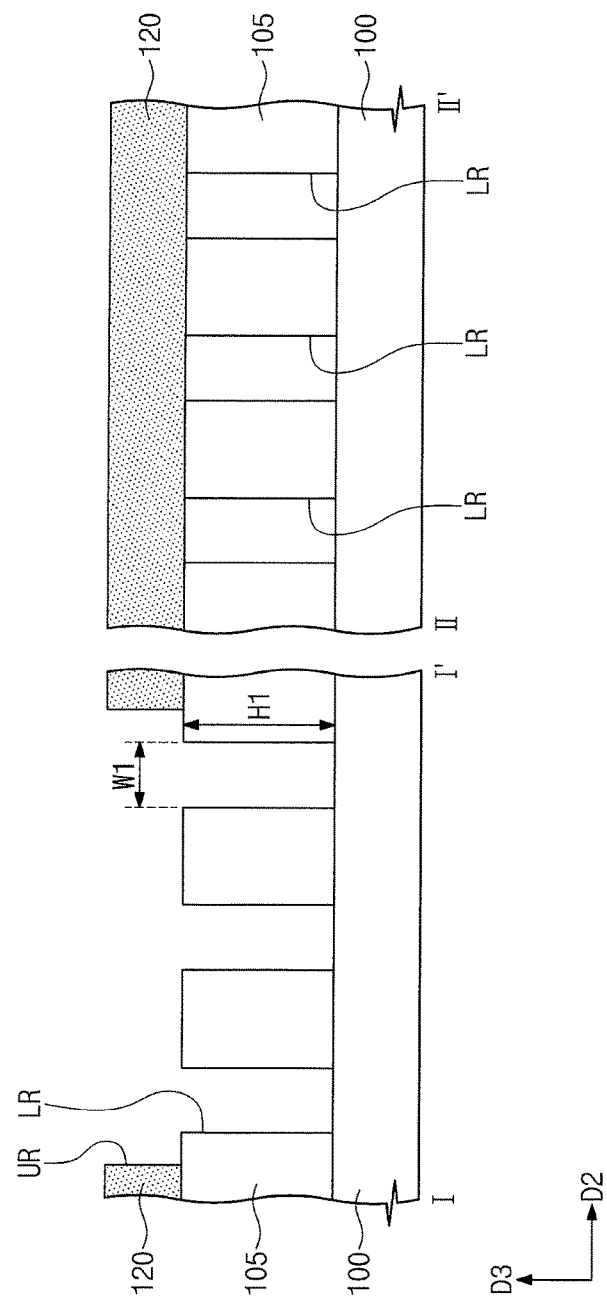
Figure 4C:
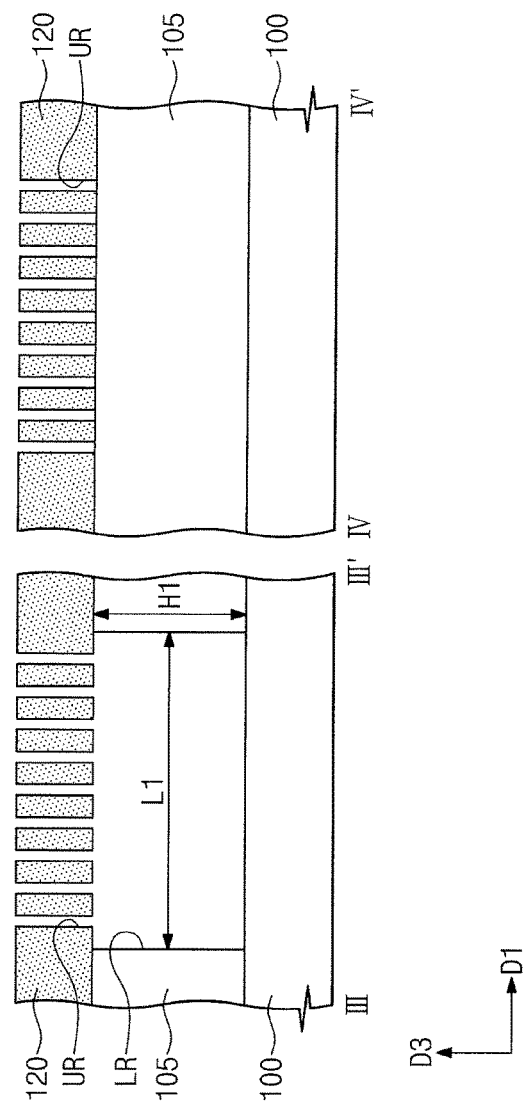

Referring to FIGS. 4A, 4B, and 4C, the preliminary active patterns 101, which are partially exposed by the second mask pattern 120, may be removed to form lower trenches LR below the second mask pattern 120.

In some embodiments, the lower trenches LR may be formed by isotropically etching the preliminary active patterns 101. The formation of the lower trenches LR may be performed using an etch recipe having an etch selectivity with respect to the device isolation layer 105 and the second mask pattern 120. For example, in the case where the semiconductor substrate 100 is a single-crystalline silicon substrate, an etchant containing HF, HNO$_3$, or NH$_4$F may be used to etching the preliminary active patterns 101.

As a result of the isotropic etching process on the preliminary active patterns 101, some regions of a bottom surface of the second mask pattern 120 and the sidewall of the device isolation layer 105 may be exposed through the lower trenches LR. The lower trenches LR, which are formed by removing the preliminary active patterns 101, may extend in the first direction D1.

In some embodiments, a first height H1 of the lower trenches LR (i.e., a distance from the top surface of the device isolation layer 105 to a bottom surface of the lower trench LR) may be at least two times the first width W1 of the lower trenches LR. For example, the lower trenches LR may be formed to have an aspect ratio of about 2:1 to about 3:1. In addition, the length L1 of the lower trenches LR in the first direction D1 may be greater than the first height H1 of the lower trenches LR. For example, the first width W1 of the lower trenches LR may be selected to be in a range from about 10 nm to about 100 nm. However, the inventive concepts are not limited thereto; for example, the length L1 of the lower trenches LR may be changed depending on a design of a semiconductor device.

In some embodiments, the first height H1 of the lower trenches LR may be substantially the same as a height of the device isolation layer 105. In certain embodiments, since the lower trenches LR are formed by an etching process, the bottom surfaces of the lower trenches LR may be positioned at a different level from that of the device isolation layer 105. For example, the first height H1 of the lower trenches LR may be less than or greater than the height of the device isolation layer 105. As an example, the bottom surfaces of the lower trenches LR may be positioned at a level higher or lower than that of the device isolation layer 105.

Furthermore, a surface of the semiconductor substrate 100 exposed through the lower trenches LR may be a (100) or (110) plane. Also, the surface of the semiconductor substrate 100 exposed by the lower trenches LR may be formed to have an angle of about 50 to 90 degrees relative to the sidewall of the device isolation layer 105.

Figure 5A:
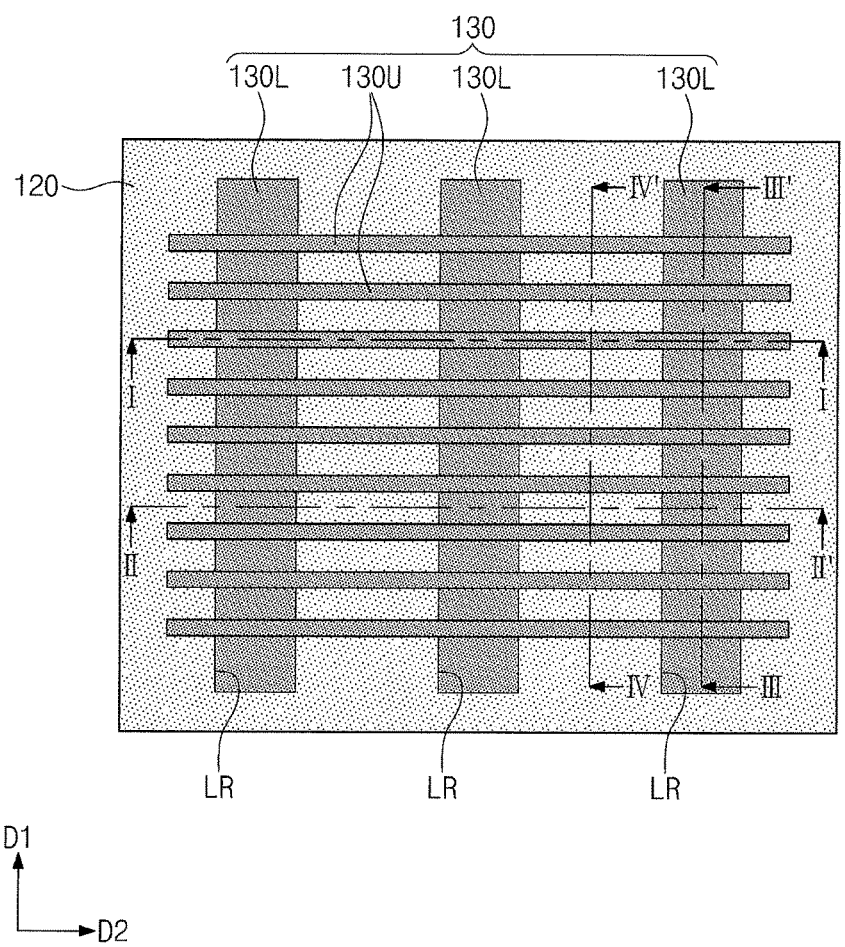
Figure 5B:
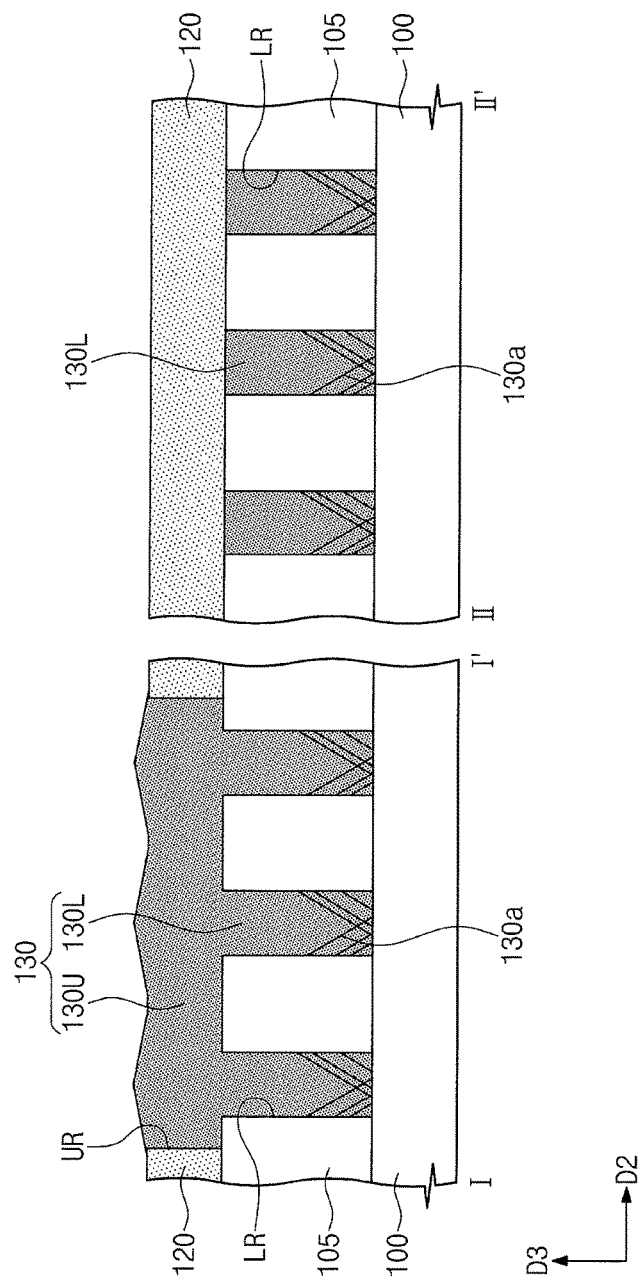
Figure 5C:
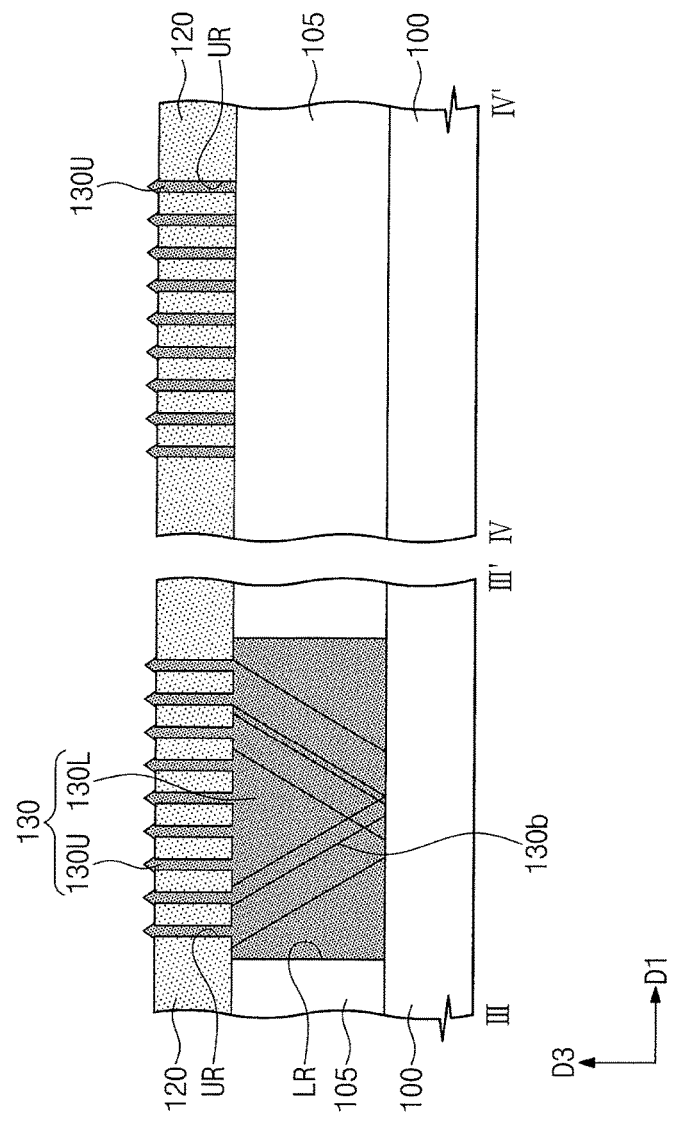

Referring to FIGS. 5A, 5B, and 5C, an epitaxial layer 130 may be formed in the lower trenches LR and the upper trenches UR. In particular, the epitaxial layer 130 may fill the lower trenches LR and the upper trenches UR.

The epitaxial layer 130 may be formed by a SEG process, in which portions of the semiconductor substrate 100 exposed by the lower trenches LR are used as a seed layer. Here, the SEG process may include solid phase epitaxy (SPE), vapor phase epitaxy (VPE), and/or liquid phase epitaxy (LPE) processes. In some embodiments, the epitaxial layer 130 may be formed by an epitaxial growth process (e.g., hetero-epitaxy) using a chemical vapor deposition (CVD), a reduced-pressure CVD (RPCVD), ultra high vacuum CVD (UHCVD), or molecular beam epitaxy (MBE).

In some embodiments, the epitaxial layer 130 may include a semiconductor material having a lattice constant that is different from that of the semiconductor substrate 100. The epitaxial layer 130 may be formed of or include, for example, at least one of Si, Ge, SiGe, or III-V compounds. The III-V compounds may be or include aluminum phosphide (AlP), gallium phosphide (GaP), indium phosphide (InP), aluminum arsenide (AlAs), gallium arsenide (GaAs), indium arsenide (InAs), aluminum antimonide (AlSb), gallium antimonide (GaSb), or indium antimonide (InSb).

In some embodiments, as a result of the SEG process, the epitaxial layer 130 may be vertically and laterally grown from portion of the surface of the semiconductor substrate 100 that is exposed by the lower trenches LR. Accordingly, the epitaxial layer 130 may fill the lower and upper trenches LR and UR. In the case where the epitaxial layer 130 is over-grown during the SEG process, the epitaxial layer 130 may include a portion that protrudes upwardly relative to the top surface of the second mask pattern 120.

The epitaxial layer 130 may include lower portions 130L that fill the lower trenches LR and upper portions 130U that fill the upper trenches UR. There may be no interface between the lower portions 130L and the upper portions 130U; that is, the epitaxial layer 130 may be a unitary body including the upper portions 130U and the lower portions 130L. The lower portions 130L of the epitaxial layer 130 may extend in the first direction D1, and the upper portions 130U of the epitaxial layer 130 may extend in the second direction D2 that is perpendicular to the first direction D1. For example, the upper portions 130U of the epitaxial layer 130 may extend horizontally from the lower portions 130L over the top surface of the device isolation layer 105. The lower portions 130L of the epitaxial layer 130 may have sidewalls defined by the device isolation layer 105, and the upper portions 130U of the epitaxial layer 130 may have sidewalls defined by the second mask pattern 120.

As an example, the epitaxial layer 130 may be grown from the (100) or (110) plane of the single-crystalline silicon substrate. The sidewalls of the epitaxial layer 130 may be oriented in the <110> crystal lattice direction. As an example, the sidewalls of the lower portions 130L of the epitaxial layer 130 may be oriented in the <110> direction, and the sidewalls of the upper portions 130U of the epitaxial layer 130 may be oriented in the <1-10> direction.

There may be a difference in lattice constant between the epitaxial layer 130 and the semiconductor substrate 100. In addition, there may be a difference in growth speed between crystal planes, during the SEG process. These differences may lead to crystal defects in the lower portions 130L of the epitaxial layer 130. For example, various crystal defects (such as, threading dislocations, misfit defects, stacking faults, twin boundaries, and/or anti-phase boundaries) may be formed in the lower portions 130L of the epitaxial layer 130.

In more detail, when the epitaxial layer 130 is grown form the surface of the semiconductor substrate 100 (e.g., a (001) plane of the silicon substrate), crystal defects 130a and 130b (e.g., threading dislocations) may be extended or propagated along the (111) plane or in the <110> direction. The crystal defects 130a and 130b may extend or propagate at an angle of about 55 degrees relative to the (001) plane of the silicon substrate. As can be seen in FIG. 5B, the crystal defects 130A may terminate in the lower portions 130L of the epitaxial layer 130, because they propagate in the second direction D2 and terminate an interface with the device isolation layer 105 due to the aspect ratio of the lower portions 130L of the epitaxial layer 130. However, referring to FIG. 5C, the crystal defects 130B propagate in the first direction D1 and thus may not terminate in the lower portions 130L of the epitaxial layer 130. Rather, the crystal defects 130B may reach the upper portions 130U of the epitaxial layer 130. However, because the upper portions 130U of the epitaxial layer 130 are oriented in a transverse direction compared to the lower portions 130L, at least some of the crystal defects 130B may terminate in the upper portions 130U of the epitaxial layer 130.

As described with reference to FIGS. 4A, 4B, and 4C, in the case where the width W1 and the height H1 of the lower trenches LR meets the condition of H1>2W1, the sidewalls of the lower trenches LR (i.e., the sidewall of the device isolation layer 105) may prevent or discourage the crystal defects 130a from propagating in a widthwise direction (e.g., the second direction D2) of the lower trenches LR, and thus, the crystal defects 130a may not extended or propagate into upper regions of the lower trenches LR. For example, in the second direction D2, the crystal defects 130a may be confined within the lower region of the lower trench LR.

Since the height (e.g., H1 of FIG. 4) of the lower trenches LR is less than the length (e.g., L1 of FIG. 4), the sidewalls of the lower trenches LR (i.e., the sidewall of the device isolation layer 105) may not prevent the crystal defects 130b from propagating into the upper region of the lower trenches LR, when viewed in the longitudinal direction (i.e., the first direction D1) of the lower trenches LR. In some embodiments, since the second mask pattern 120 is provided to define the upper trenches UR extending in the second direction D2, such propagation or extension of the crystal defects 130b may be impeded or prevented by the second mask pattern 120. Thus, the upper trenches UR may be filled with the epitaxial layer 130, in which the crystal defect is absent. In other words, it may be possible to confine the crystal defects of the epitaxial layer 130 within the lower trenches LR, and thus, the upper portions 130U of the epitaxial layer 130 filling the upper trenches UR may be formed of a substantially defect-free semiconductor material. In this context, "substantially defect-free" means that the material is free of crystal defects that would materially affect the operation of a device formed using the material.

Furthermore, since there is a difference in crystal growth rate between crystal planes in the SEG process, the top surface of the epitaxial layer 130 may have facets that are inclined to the top surface of the semiconductor substrate 100. For example, the top surface of the epitaxial layer 130 may be composed of (111) planes. In some embodiments, the epitaxial layer 130 may be over-grown to have a pyramid-shaped upper portion protruding relative to the top surface of the second mask pattern 120.

Figure 6A:
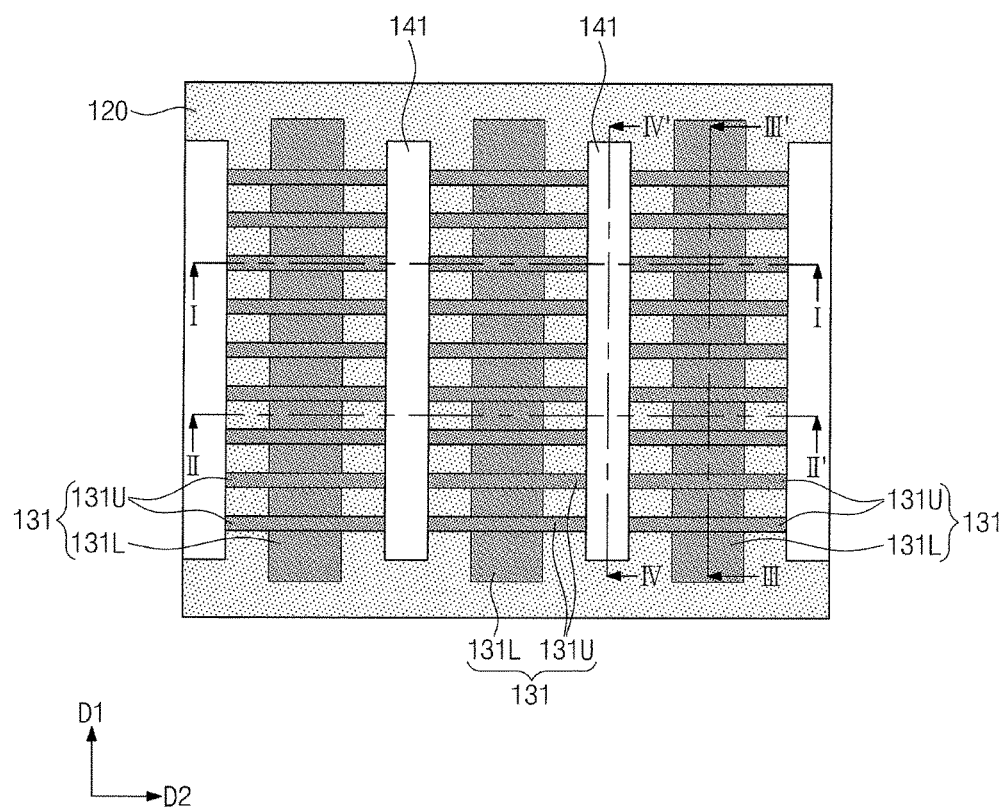
Figure 6B:
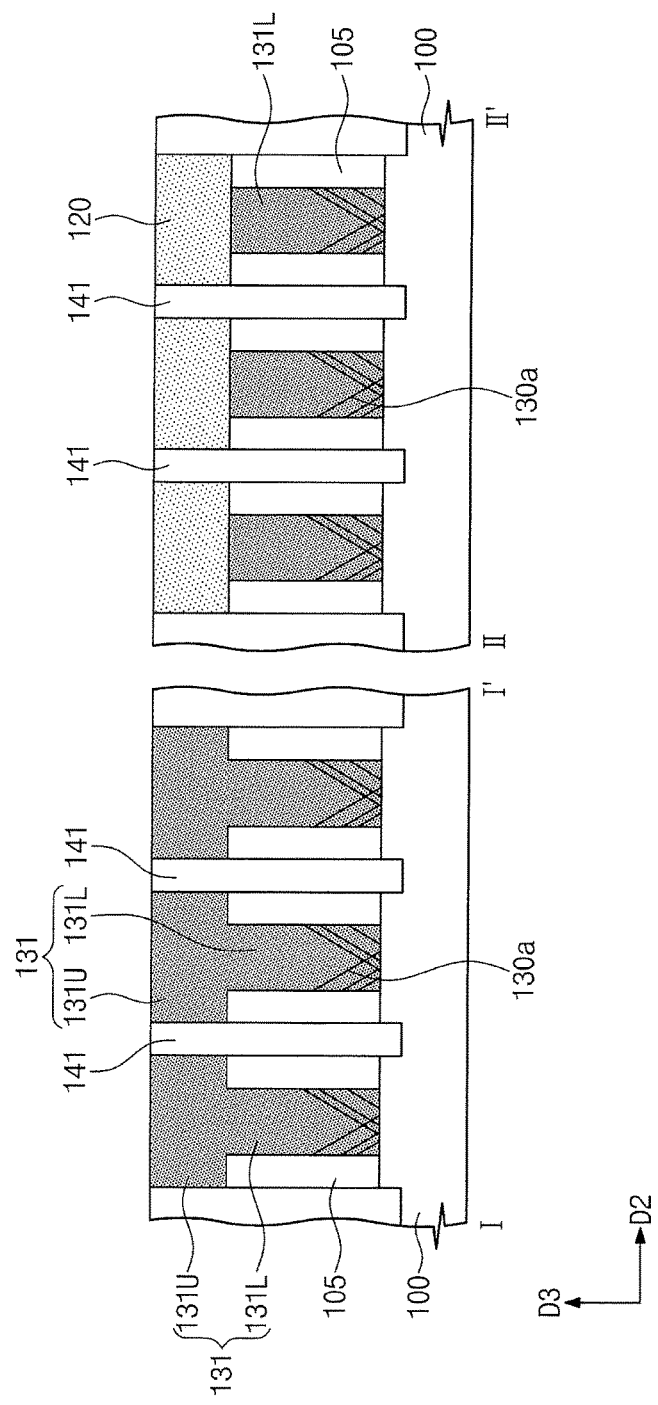

Referring to FIGS. 6A, 6B, and 6C, after the formation of the epitaxial layer 130, a planarization process may be performed to remove the protruding portion of the epitaxial layer 130 protruding relative to the top surface of the device isolation layer 105. The planarization process may be performed using an etch-back method and/or a chemical mechanical polishing (CMP) method. As a result of the planarization process, the top surface of the epitaxial layer 130 may be substantially coplanar with that of the second mask pattern 120.

Next, first insulating separation patterns 141 may be formed to extend in the first direction D1 and thereby to cross the upper portions 130U of the epitaxial layer 130.

The formation of the first insulating separation patterns 141 may include forming a mask pattern (not shown), in which openings extending in the first direction D1 are formed, on the second mask pattern 120, anisotropically etching the epitaxial layer using the mask pattern as an etch mask to form trenches, forming a first insulating separation layer to fill the trenches, and planarizing the first insulating separation layer to expose the upper portions of the epitaxial layer.

As an example, the first insulating separation patterns 141 may be formed to penetrate the upper portions 130U of the epitaxial layer 130 and the device isolation layer 105. For example, when the trenches extending in the first direction D1 are formed, the epitaxial layer 130 and the device isolation layer 105 may be etched to expose the semiconductor substrate 100. Thus, the first insulating separation patterns 141 may be in contact with the semiconductor substrate 100. In some embodiments, bottom surfaces of the first insulating separation patterns 141 may be positioned at a lower level than the bottom surface of the device isolation layer 105. In certain embodiments, the bottom surfaces of the first insulating separation patterns 141 may be positioned between the top and bottom surfaces of the device isolation layer 105, as shown in FIGS. 11A and 11B.

As a result of the formation of the first insulating separation patterns 141, each epitaxial layer 130 may be divided into a plurality of epitaxial patterns 131 that are separated from each other in the second direction D2. Here, each of the epitaxial patterns 131 may be provided in the form of a unitary body and may include a lower portion extending in the first direction D1 and a plurality of upper portions 131U extending in the second direction D2. That is, in each of the epitaxial patterns 131, the upper portions 131U may be connected to the unitary lower portion. The first insulating separation patterns 141 may be formed between and parallel to lower portions 131L of the epitaxial patterns 131.

Figure 7A:
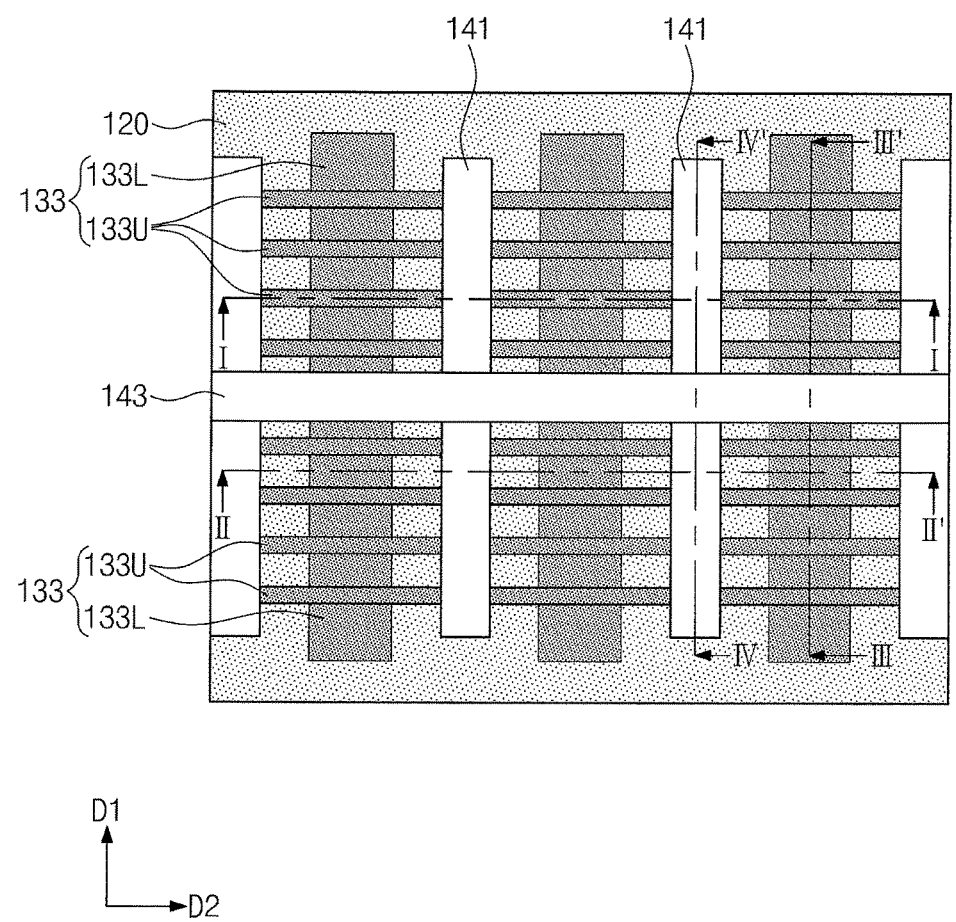
Figure 7B:
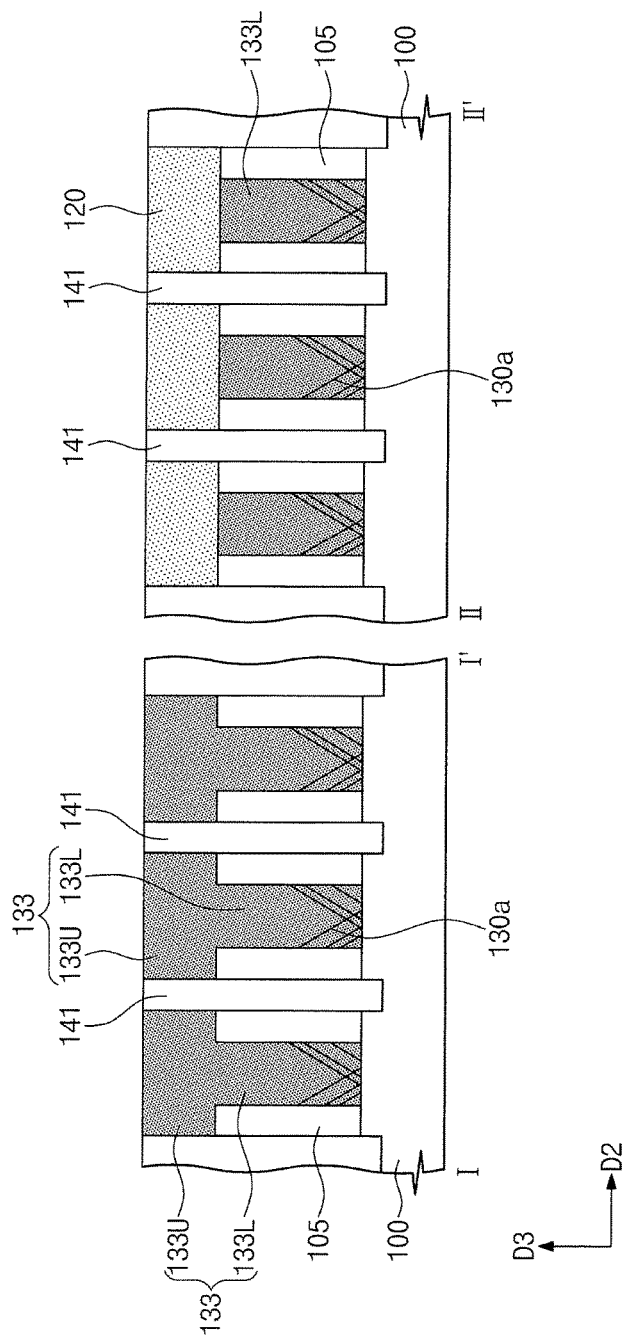
Figure 7C:
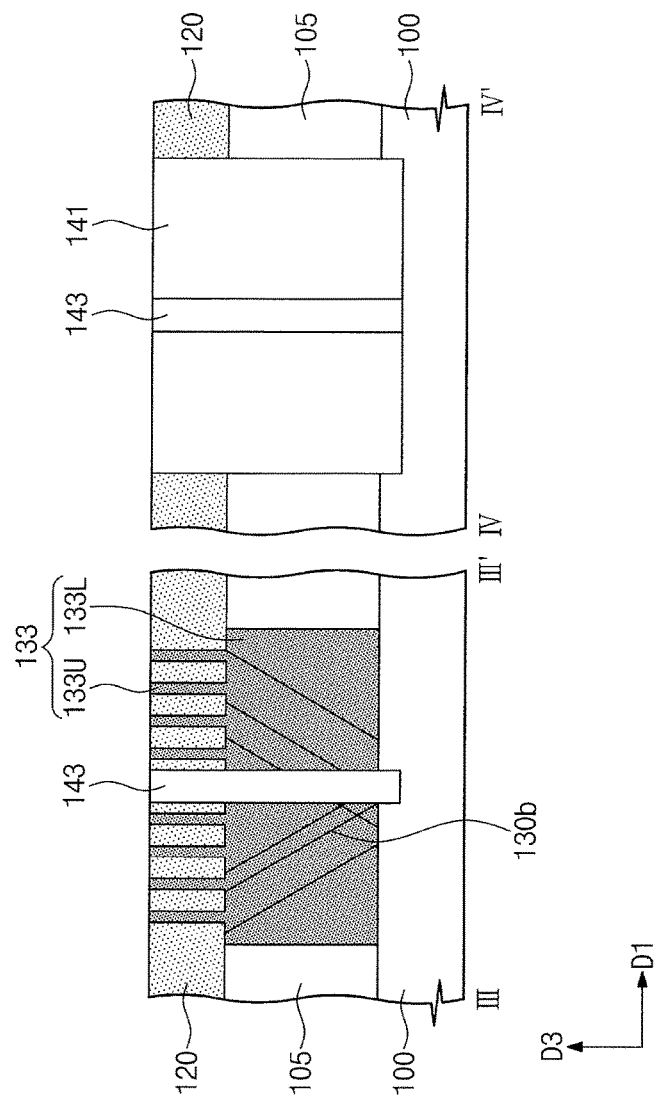

Referring to FIGS. 7A, 7B, and 7C, second insulating separation patterns 143 may be formed to cross the lower portions 131L of the epitaxial patterns 131 and to extend in the second direction D2.

The formation of the second insulating separation patterns 143 may include forming a mask pattern, in which openings extending in the second direction D2 are formed, on the second mask pattern 120, anisotropically etching the second mask pattern 120 and the epitaxial patterns 131 using the mask pattern as an etch mask to form trenches, filling the trenches with a second insulating separation layer, and planarizing the second insulating separation layer to expose the second mask pattern 120.

In certain embodiments, the formation of the second insulating separation patterns 143 may be performed before the formation of the first insulating separation patterns 141.

In certain embodiments, the second insulating separation patterns 143 may be formed at the same time as the first insulating separation patterns 141 described with reference to FIGS. 6A, 6B, and 6C. In this case, after the formation of the epitaxial layer 130, a mask pattern may be formed on the second mask pattern 120 to have openings extending in the first direction D1 and the second direction D2.

The second insulating separation patterns 143 may be provided to penetrate the lower portions 131L of the epitaxial patterns 131 and may be in contact with the semiconductor substrate 100. A bottom surface of the second insulating separation patterns 143 may be positioned at a lower level than that of the device isolation layer 105.

As a result of the formation of the second insulating separation patterns 143, each of the epitaxial patterns 131 may be divided into a plurality of fin structures 133 that are separated from each other in the first direction D1. Here, each of the fin structures 133 may be provided in the form of a unitary body and may include a lower portion 133L extending in the first direction D1 and a plurality of upper portions 133U extending in the second direction D2. That is, in each of the fin structures 133, the upper portions 133U may be connected in common to the lower portion 133L. The second insulating separation patterns 143 may be formed between the lower portions 133L of the fin structures 133 adjacent to each other in the first direction D1 and may extend parallel to the upper portions 133U of the fin structures 133.

Figure 8A:
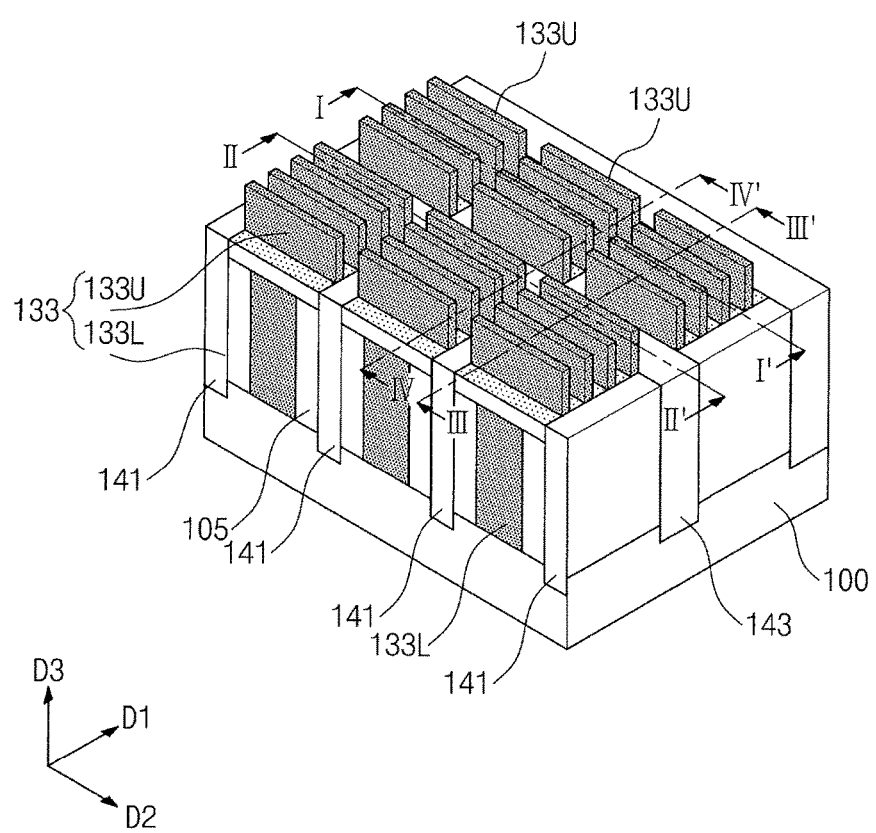
Figure 8B:
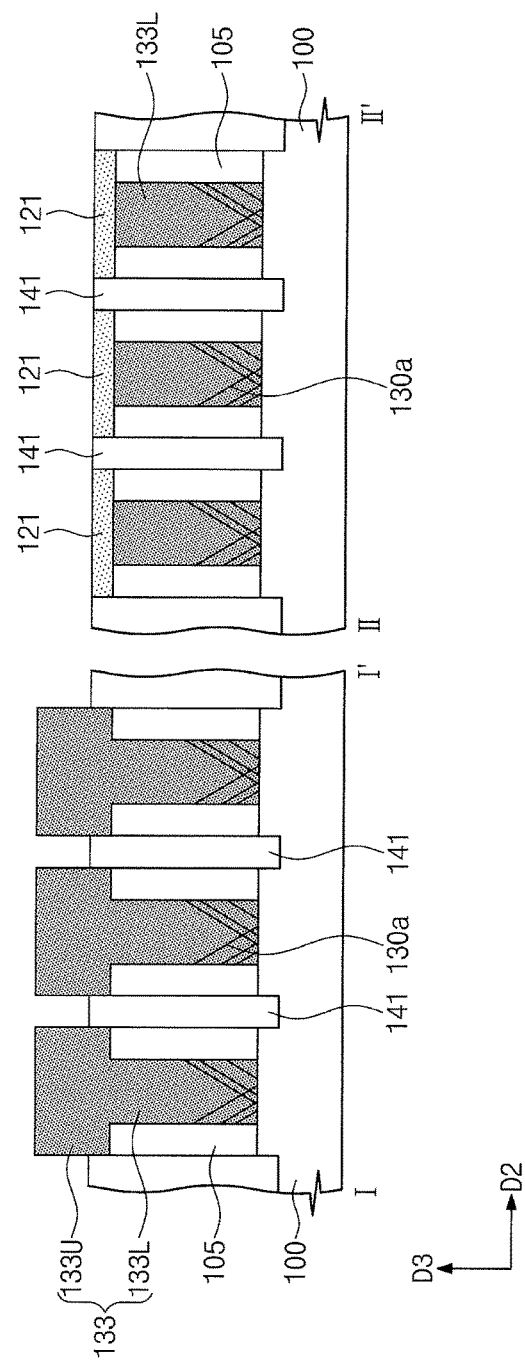
Figure 8C:
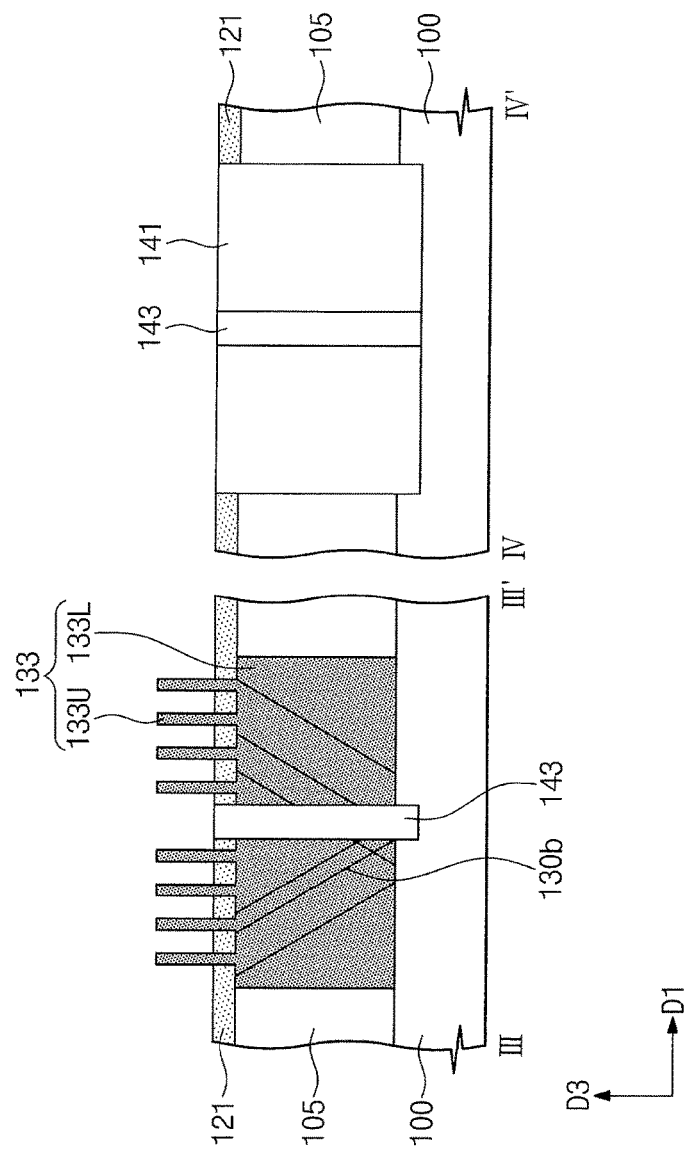

Referring to FIGS. 8A, 8B, and 8C, the top surface of the second mask pattern 120 and the top surfaces of the first and second insulating separation patterns 141 and 143 may be recessed to partially expose sidewalls of the upper portions 133U of the fin structures 133.

In some embodiments, the first and second insulating separation patterns 141 and 143 may be formed of an insulating material having an etch selectivity with respect to the second mask pattern 120. In this case, the recess process of exposing the sidewalls of the upper portions 133U of the fin structures 133 may include an etching step of recessing the top surfaces of the first and second insulating separation patterns 141 and 143 and an etching step of recessing the top surface of the second mask pattern 120. In certain embodiments, the top surfaces of the first and second insulating separation patterns 141 and 143 and the top surface of the second mask pattern 120 may be etched simultaneously using the same etching step.

In some embodiments, on the lower portions 133L of the fin structures 133, the recessed first and second insulating separation patterns 141 and 143 and a recessed second mask pattern 121 may be formed to partially enclose the upper portions 133U of the fin structures 133.

Figure 9A:
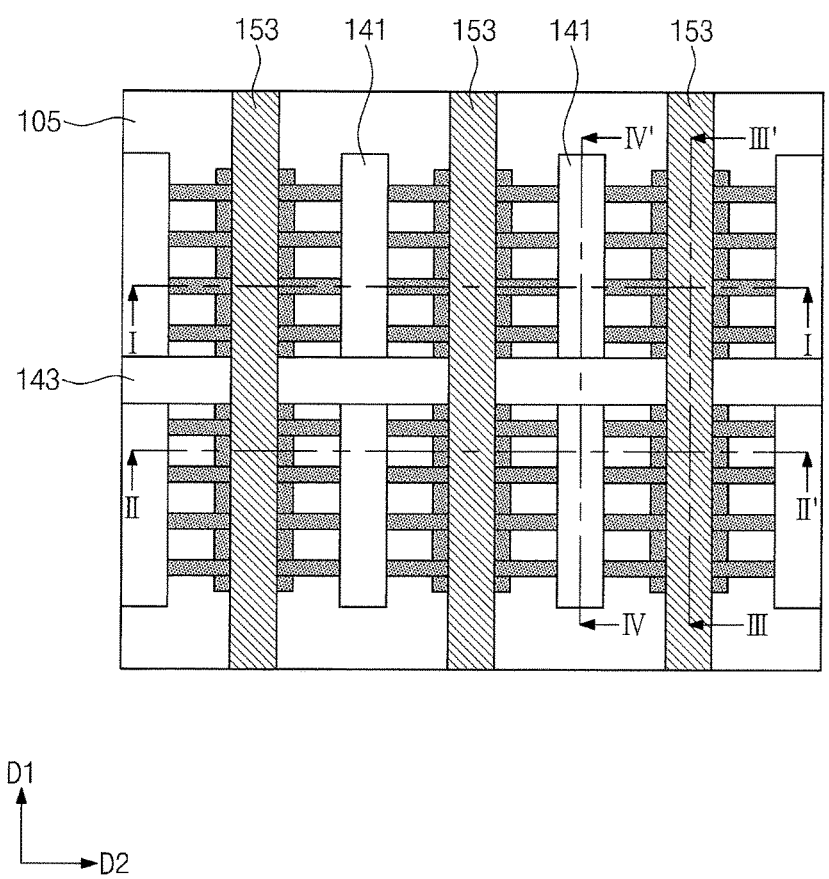
Figure 9B:
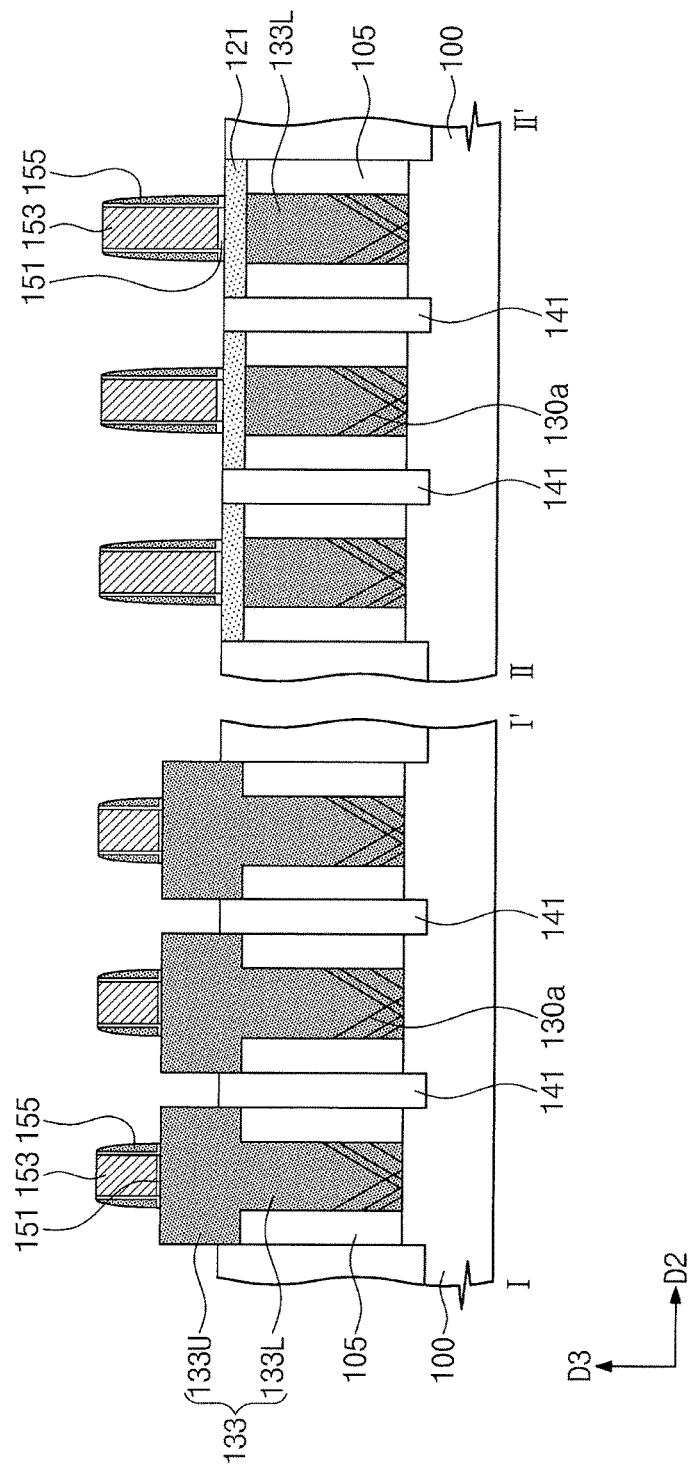
Figure 9C:
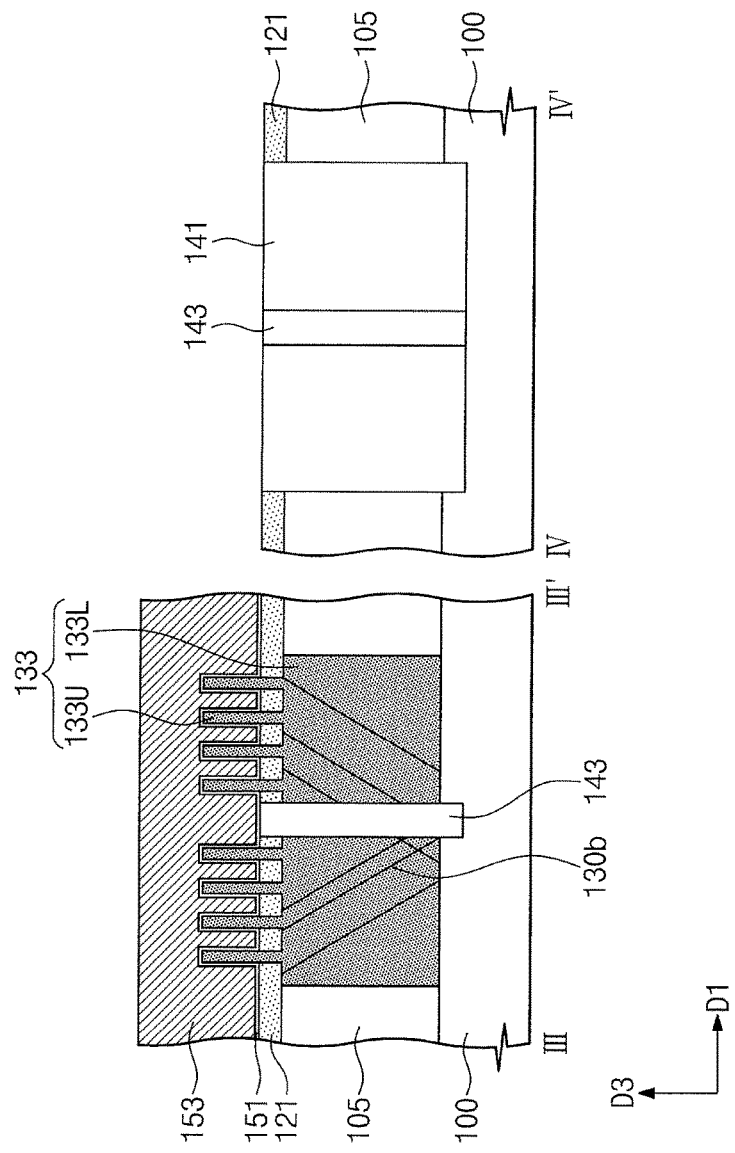

Referring to FIGS. 9A, 9B, and 9C, a gate insulating layer 151 and a gate electrode 153 may be formed to cross the upper portions 133U of the fin structures 133.

In some embodiments, the gate electrode 153 may extend parallel to the lower portions 133L of the fin structures 133 or in the first direction D1. When viewed in a plan view, the gate insulating layer 151 and gate electrodes 153 may be overlapped with the lower portions 133L of the fin structures 133. For example, the lower portions 133L of the fin structures 133 may be disposed below the gate electrode 153 and may be spaced apart from each other in the first direction D1. In some embodiments, the gate electrode 153 may have a width that is smaller than or equal to that of the lower portions 133L of the fin structures 133.

The gate insulating layer 151 may be formed of or include at least one of high-k dielectric materials (e.g., hafnium oxide, hafnium silicate, zirconium oxide, or zirconium silicate). The gate insulating layer 151 may be formed by an atomic layer deposition process to conformally cover the upper portions 133U of the fin structures 133. Alternatively, the gate insulating layer 151 may be formed by performing a thermal oxidation process on the surfaces of the upper portions 133U of the fin structures 133 exposed by the recessed second mask pattern 121.

The gate electrode 153 may be formed of a doped poly-silicon layer, an undoped poly-silicon layer, a silicon germanium layer, or a silicon carbide layer. In certain embodiments, the gate electrode 153 may be formed of or include at least one of doped semiconductor materials (e.g., doped silicon), metals (e.g., tungsten, aluminum, titanium, or tantalum), conductive metal nitrides (e.g., titanium nitride, tantalum nitride, or tungsten nitride), or metal-semiconductor compounds (e.g., metal silicide).

Gate spacers 155 may be formed on both sidewalls of the gate electrode 153. The formation of the gate spacers 155 may include forming a gate spacer layer to conformally cover the gate electrode 153 and anisotropically etching the gate spacer layer.

Figure 10B:
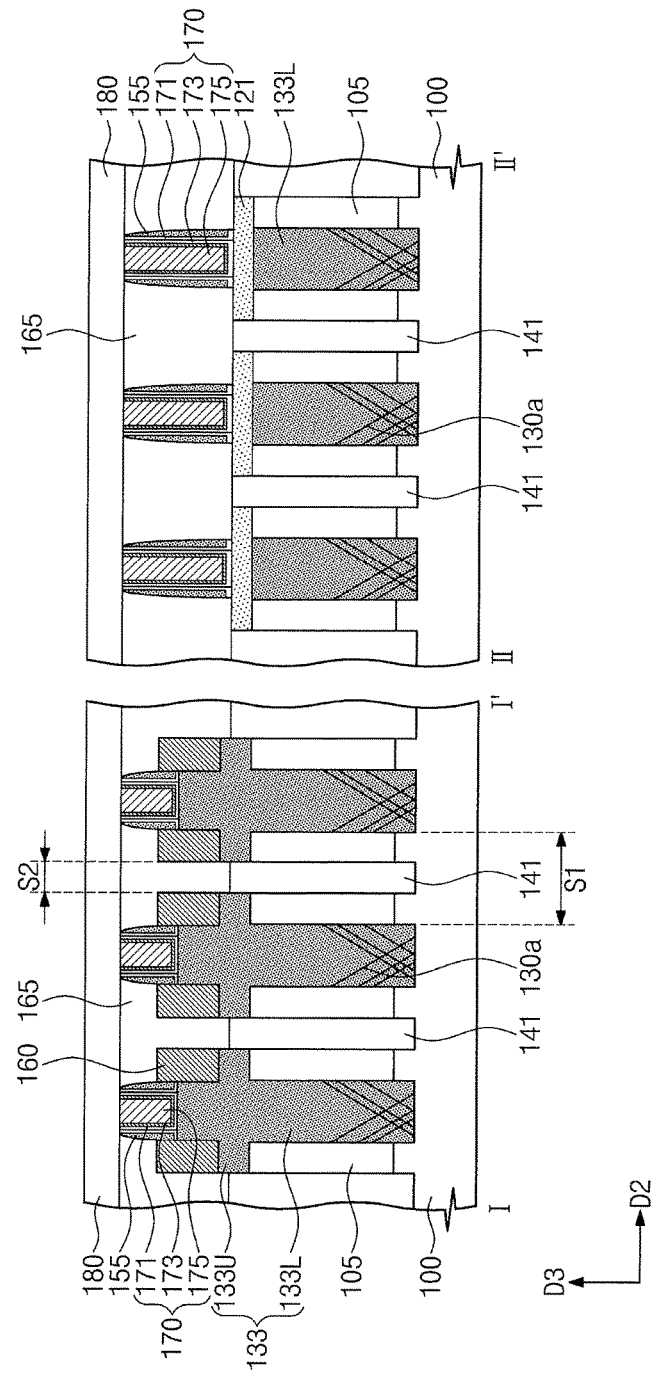
Figure 10C:
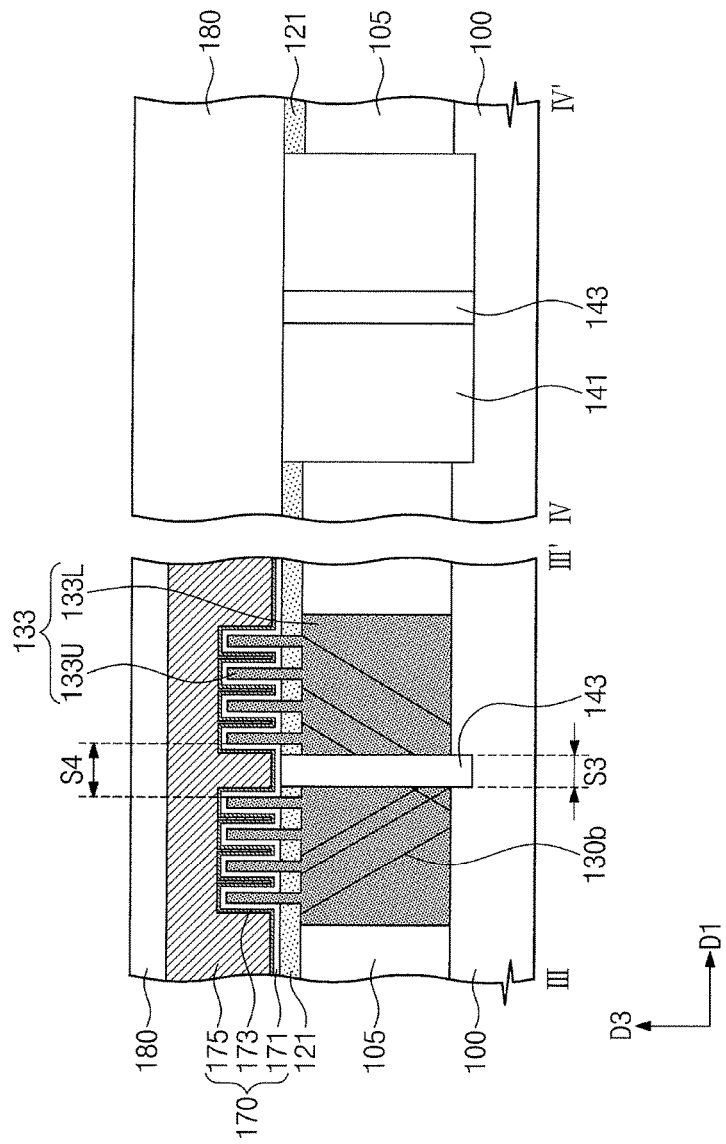

Referring to FIGS. 10A, 10B, and 10C, source and drain regions 160 may be formed in the upper portions 133U of the fin structures 133 and at both sides of the gate electrode 153.

In some embodiments, the formation of the source and drain regions 160 may include partially etching the upper portions 133U of the fin structures 133 at both sides of the gate electrode 153 and forming an epitaxial layer. Here, the epitaxial layer may be formed of a semiconductor material capable of exerting a tensile or compressive strain on a channel region of a field-effect transistor. For NMOS FETs, the epitaxial layer may be formed of silicon carbide (SiC). For PMOS FETs, the epitaxial layer may be formed of silicon germanium (SiGe). Although not illustrated in the drawings, a silicide layer (e.g., nickel silicide, cobalt silicide, tungsten silicide, titanium silicide, niobium silicide, or tantalum silicide) may be formed on surfaces of the source and drain regions 160.

In certain embodiments, the formation of the source and drain regions 160 may include implanting n- or p-type impurities into the upper portions 133U of the fin structures 133, and in this case, the gate electrode 153 may be used as an ion implantation mask.

After the formation of the source and drain regions 160, a first interlayer insulating layer 165 may be formed to cover the gate electrode 153 and the source and drain regions 160. As an example, the first interlayer insulating layer 165 may be formed to fill a gap between the gate electrodes 153 and to expose top surfaces of the gate electrodes 153.

After the formation of the first interlayer insulating layers 165, the gate electrodes 153 may be replaced with metal gate electrodes 170. For example, the formation of the metal gate electrodes 170 may include removing the gate electrode 153 to form gate regions between gate spacers 155 and sequentially forming a gate dielectric layer 171, a barrier metal layer 173, and a metal layer 175 in the gate regions.

The gate dielectric layer 171 may be formed of at least one of high-k dielectric materials (e.g., hafnium oxide, hafnium silicate, zirconium oxide, or zirconium silicate).

The barrier metal layer 173 may be formed of a conductive material; for example, the barrier metal layer 173 may be formed of or include at least one of metal nitrides (e.g., titanium nitride, tantalum nitride, tungsten nitride, hafnium nitride, or zirconium nitride). The metal layer 175 may be formed to have a lower electric resistivity than that of the barrier metal layer 173. For example, the metal layer 175 may be formed of or include at least one of tungsten, copper, hafnium, zirconium, titanium, tantalum, aluminum, ruthenium, palladium, platinum, cobalt, nickel, or conductive metal nitrides.

After the formation of the metal gate electrodes 170, a second interlayer insulating layer 180 may be formed on the first interlayer insulating layer 165 to cover top surfaces of the metal gate electrodes 170.

Figure 12:
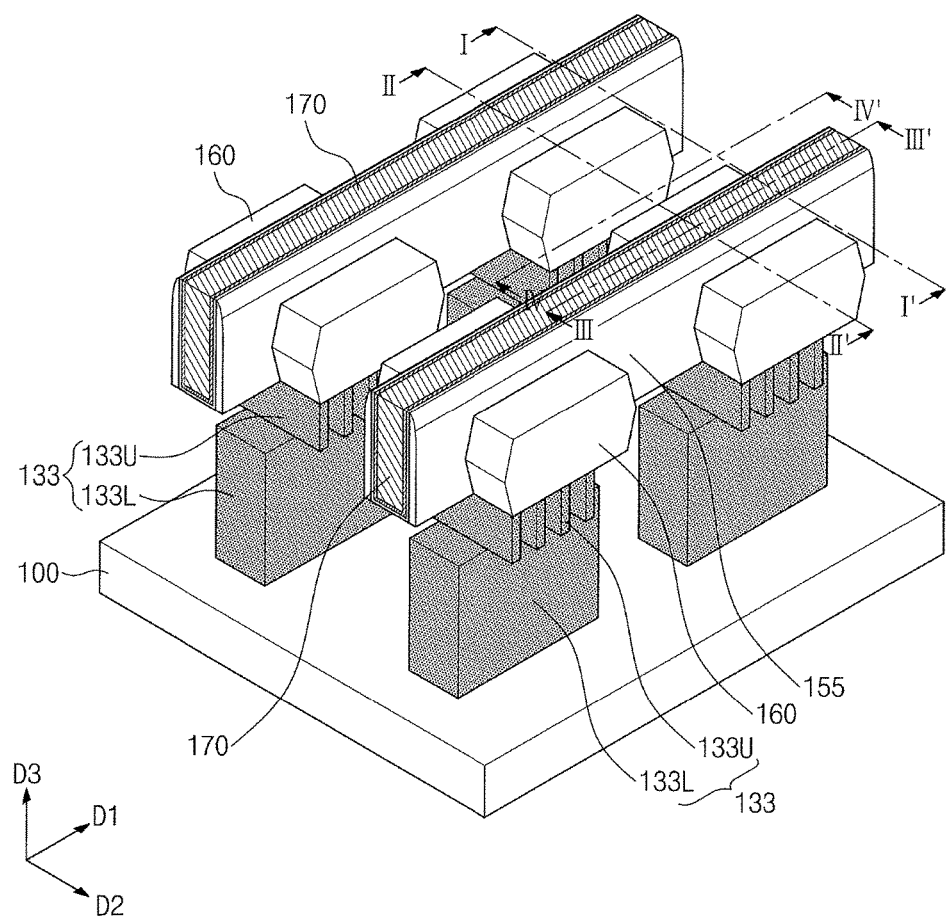
FIG. 12 is a perspective view exemplarily illustrating a semiconductor device according to some embodiments of the inventive concepts.
Figure 13:
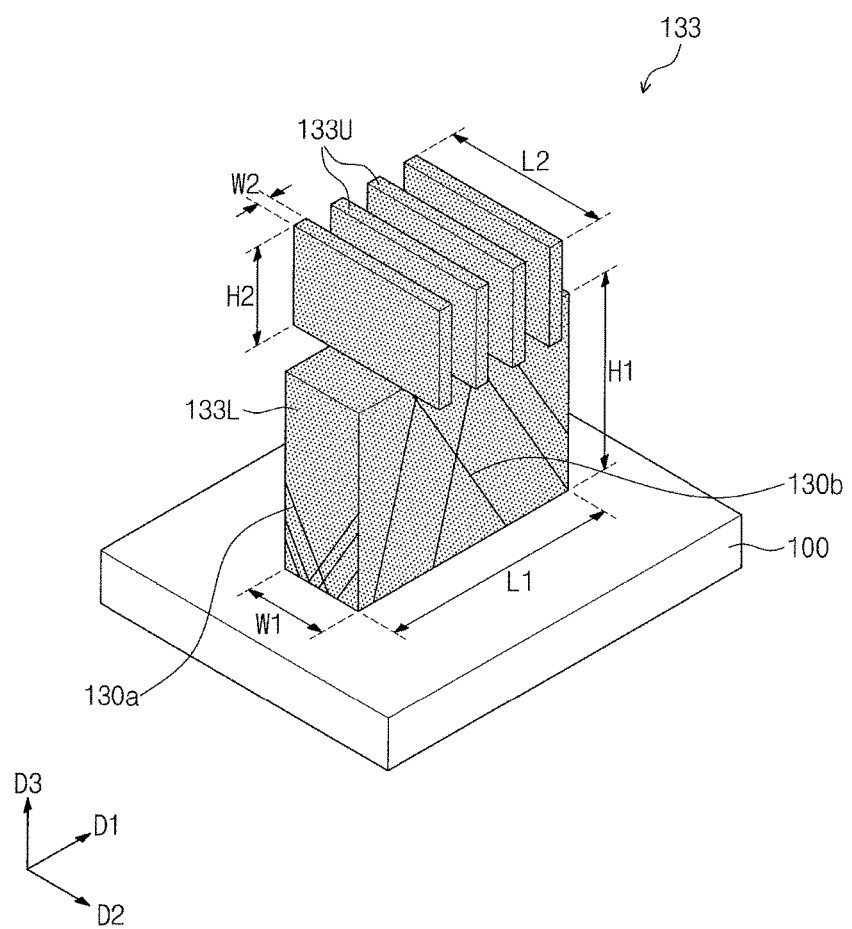
FIG. 13 is a perspective view illustrating a fin structure of a semiconductor device according to some embodiments of the inventive concepts.

FIG. 12 is a perspective view exemplarily illustrating a semiconductor device according to further embodiments of the inventive concepts. FIG. 13 is a perspective view illustrating a fin structure of a semiconductor device according to further embodiments of the inventive concepts. In the following description, an element described with reference to FIGS. 1A to 10A, and FIGS. 1B to 10B, and FIGS. 1C to 10C may be identified by a similar or identical reference number without repeating an overlapping description thereof, for the sake of brevity.

Referring to FIGS. 12 and 13, a plurality of the fin structures 133 spaced apart from each other may be provided on the semiconductor substrate 100. As an example, the fin structures 133 may be spaced apart from each other in the first and second directions D1 and D2 crossing each other.

In some embodiments, the semiconductor substrate 100 may be formed of a first semiconductor material, and the fin structures 133 may be formed of a second semiconductor material having a lattice constant is different from that of the first semiconductor material. As an example, the second semiconductor material may have a lattice constant larger than that of the first semiconductor material. Each of the first and second semiconductor materials may include at least one of, for example, silicon (Si), germanium (Ge), silicon germanium (SiGe), gallium arsenide (GaAs), indium gallium arsenide (InGaAs), or aluminum gallium arsenide (AlGaAs).

In some embodiments, each of the fin structures 133 may include the lower portion 133L, which is provided on the semiconductor substrate 100 and extends in the first direction D1, and a plurality of the upper portions 133U, which protrude from the lower portion 133L and extend in the second direction D2 crossing the first direction D1. Here, the first direction D1 may be parallel to a <110> direction, and the second direction D2 may be parallel to a <1-10> direction that is perpendicular to the first direction D1.

In detail, as shown in FIG. 13, in each of the fin structures 133, the lower portion 133L may have a first length L1 in the first direction D1 and a first width W1 in the second direction D2. Also, the lower portion 133L may have a first height H1 that is greater than about two times the first width W1. The first length L1 of the lower portion 133L may be greater than the first height H1.

In each of the fin structures 133, each of the upper portions 133U may have a second width W2, which is smaller than the first width W1, in the first direction D1, and may have a second length L2 in the second direction D2. The upper portions 133U may have a second height H2 that is greater than about two times the second width W2.

In some embodiments, each of the fin structures 133 may be provided in the form of a unitary body. That is, the lower portion 133L of each fin structure 133 may be connected to the upper portions 133U without any interface formed therebetween. In each of the fin structures 133, the lower portion 133L may have crystal defects extending or propagating in a direction inclined to the top surface of the semiconductor substrate 100. For example, on a (111) plane, the lower portion 133L may include the crystal defects 130a extending or propagating in the second direction D2 and the crystal defects 130b extending or propagating in the first direction D1. Here, a mask pattern disposed between the upper portions 133U of each fin structure 133 may prevent the crystal defects extending in the second direction D2 from propagating into the upper portions 133U. Accordingly, the upper portions 133U of the fin structures 133 may be formed of a substantially defect-free second semiconductor material.

Referring to FIGS. 10A, 10B, and 10C and FIG. 12, the lower portions 133L adjacent to each other in the second direction D2 may be spaced apart from each other by a first distance S1, and the upper portions 133U may be spaced apart from each other by a second distance S2 that is smaller than the first distance SI.

The device isolation layer 105 may be provided between the lower portions 133L of the fin structures 133 adjacent to each other in the second direction D2. The first insulating separation pattern 141 may be provided between the upper portions 133U of the fin structures 133 adjacent to each other in the second direction D2, and the top surface of the first insulating separation pattern 141 may be positioned at a level lower than top surfaces of the upper portions 133U of the fin structures 133.

The lower portions 133L of the fin structures 133 adjacent to each other in the first direction D1 may be spaced apart from each other by a third distance S3, and the upper portions 133U of the fin structures 133 adjacent to each other in the first direction D1 may be spaced apart from each other by a fourth distance S4 that is larger than the third distance S3.

The second insulating separation pattern 143 may be provided between the lower portions 133L of the fin structures 133 adjacent to each other in the first direction D1, and the top surface of the second insulating separation pattern 143 may be positioned at a level lower than top surfaces of the upper portions 133U of the fin structures 133.

Referring back to FIG. 12, the metal gate electrode 170 may be provided to cross the upper portions 133U that are spaced apart from each other in the first direction D1. Furthermore, when viewed in a plan view, the metal gate electrode 170 may overlap the lower portions 133L that are spaced apart from each other in the first direction D1. In other words, the lower portions 133L that are adjacent to each other in the first direction D1 may be spaced apart from each other below the metal gate electrode 170.

A gate insulating layer may be provided between the metal gate electrode 170 and the upper portions 133U and may cover surfaces of the upper portions 133U with a uniform thickness. The source and drain regions 160 may be provided on the upper portions 133U of each fin structure 133 and at both sides of the metal gate electrode 170.

Figure 14A:
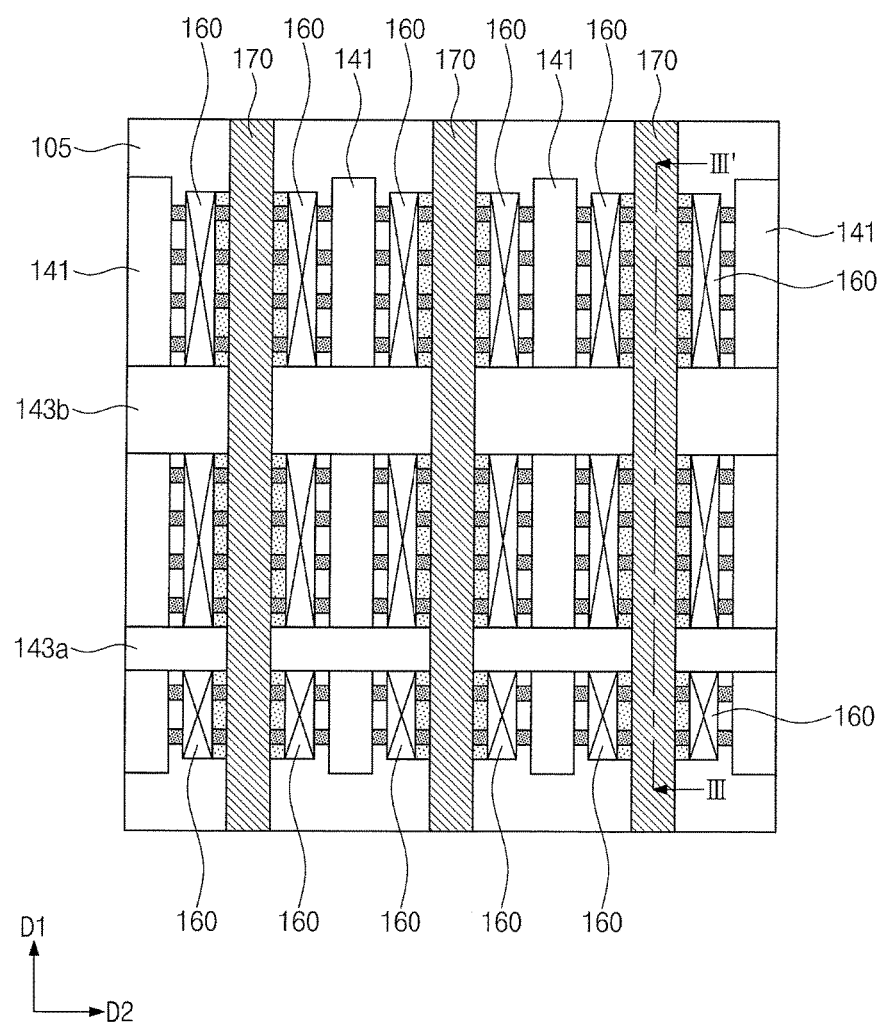
FIGS. 14A, 14B, 15A, and 15B are diagrams illustrating semiconductor devices according to some embodiments of the inventive concepts.
Figure 14B:
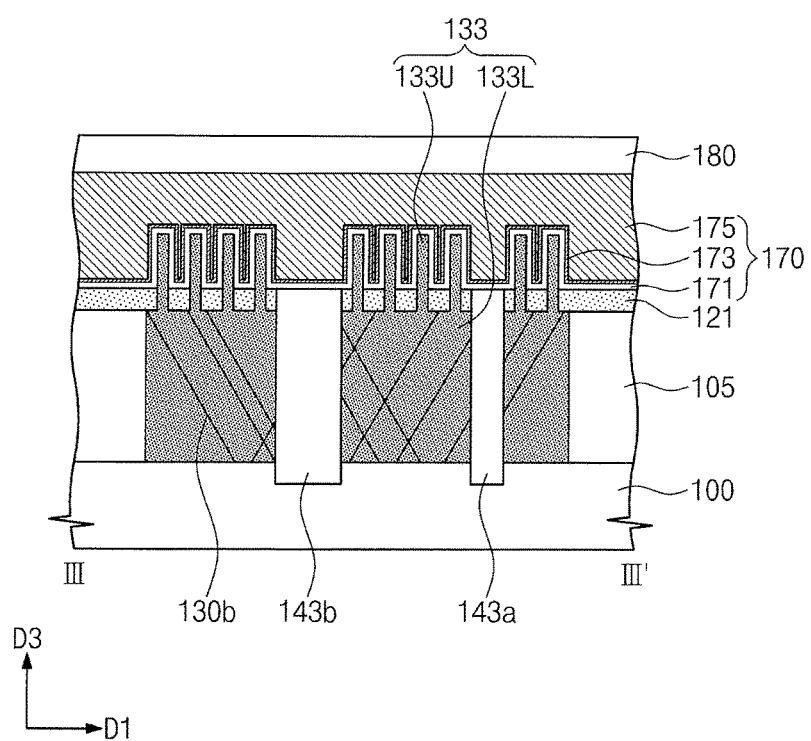
Figure 15A:
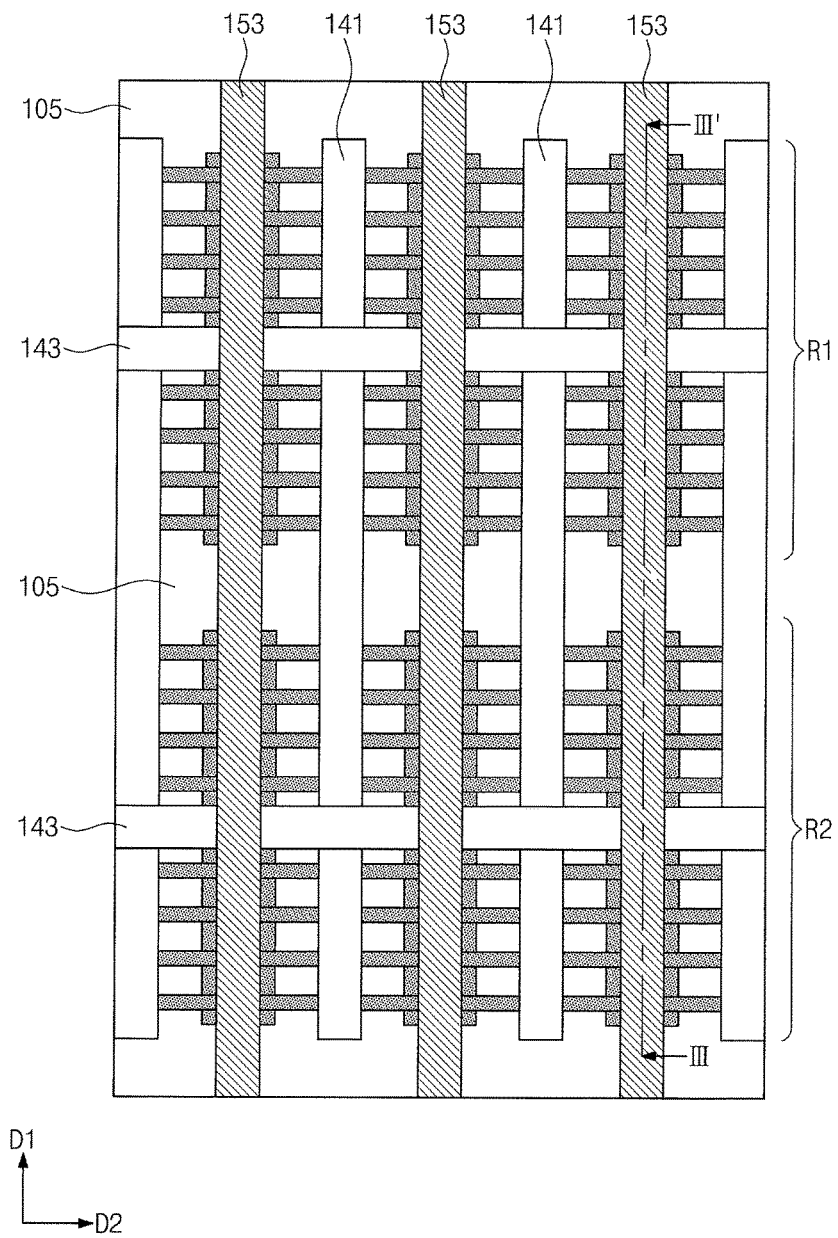
Figure 15B:
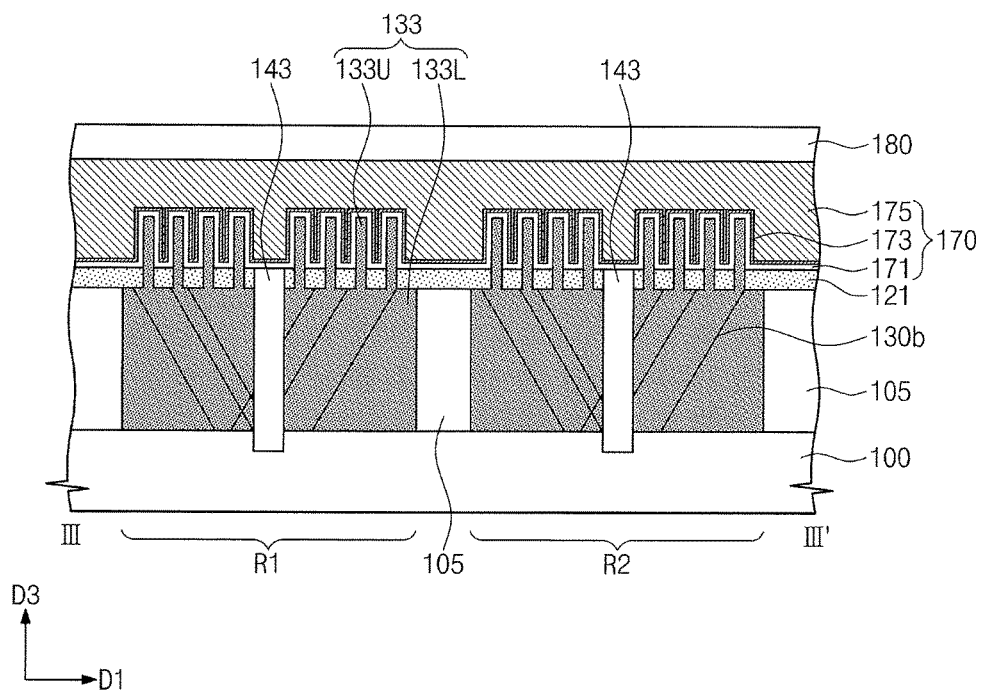

FIGS. 14A, 14B, 15A, and 15B are diagrams illustrating semiconductor devices according to some further embodiments of the inventive concepts. For example, FIG. 14B is a sectional view taken along line of FIG. 14A, and FIG. 15B is a sectional view taken along line of FIG. 15A. In the following description, a previously described element may be identified by a similar or identical reference number without repeating an overlapping description thereof, for the sake of brevity.

Referring to FIGS. 14A and 14B, the fin structures 133 may be provided on the semiconductor substrate 100 to be spaced apart from each other in the first direction D1 and the second direction D2. According to the present embodiment, a space between the fin structures 133 adjacent to each other in the first direction D1 may have at least two different values. For example, the second insulating separation patterns 143a and 143b extending in the second direction D2 may have at least two different widths.

According to some embodiments of the inventive concepts, the number of the upper portions 133U may be changed in the fin structures. For example, the number of the upper portions 133U in one of the fin structures 133 may be different from that in another.

Referring to FIGS. 15A and 15B, the semiconductor substrate 100 may include a first region R1 and a second region R2. On each of the first and second regions R1 and R2, plurality of the fin structures 133 may be spaced apart from each other in the first and second directions D1 and D2.

In some embodiments, the device isolation layer 105 may be provided between the fin structures 133, which are respectively provided on the first and second regions R1 and R2 in the first direction D1. On each of the first and second regions R1 and R2, the lower portions 133L of the fin structures 133 adjacent to each other in the first direction D1 may be spaced apart from each other by the second insulating separation pattern 143 (for example, by the first distance). The lower portions 133L of the fin structures 133, which are adjacent to each other in the first direction D1 and are respectively provided on the first and second regions R1 and R2, may be spaced apart from each other by the device isolation layer 105 (for example, by the second distance). Here, the second distance may be greater than the first distance.

The metal gate electrodes 170 may be provided to cross the first and second regions R1 and R2 and to cross the upper portions 133U of the fin structures 133 of the first and second regions R1 and R2.

Figure 16:
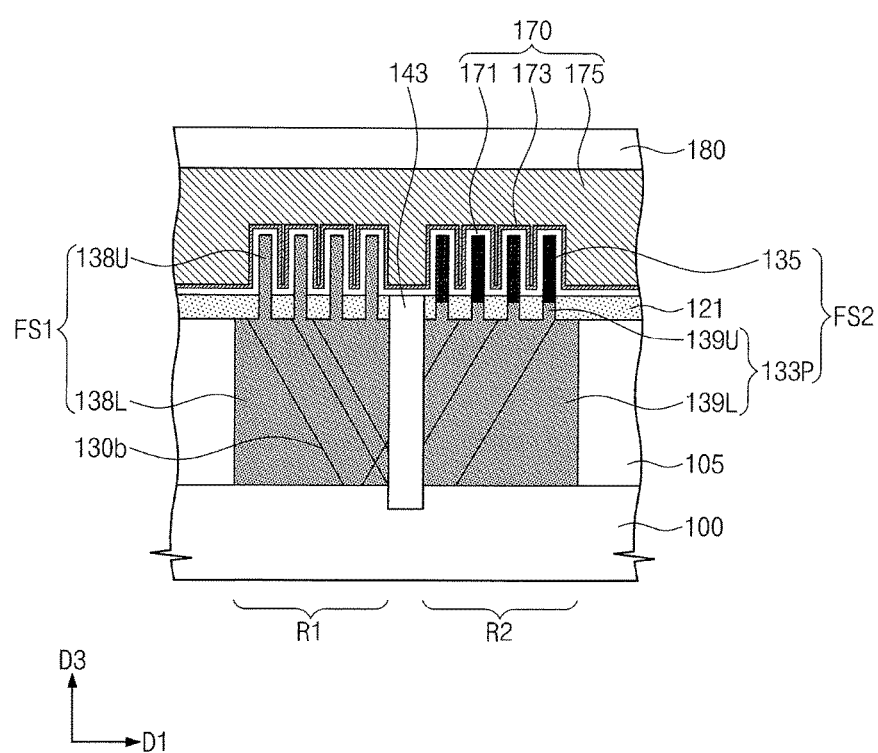
FIGS. 16 and 17 are sectional views illustrating semiconductor devices according to some embodiments of the inventive concepts.
Figure 17:
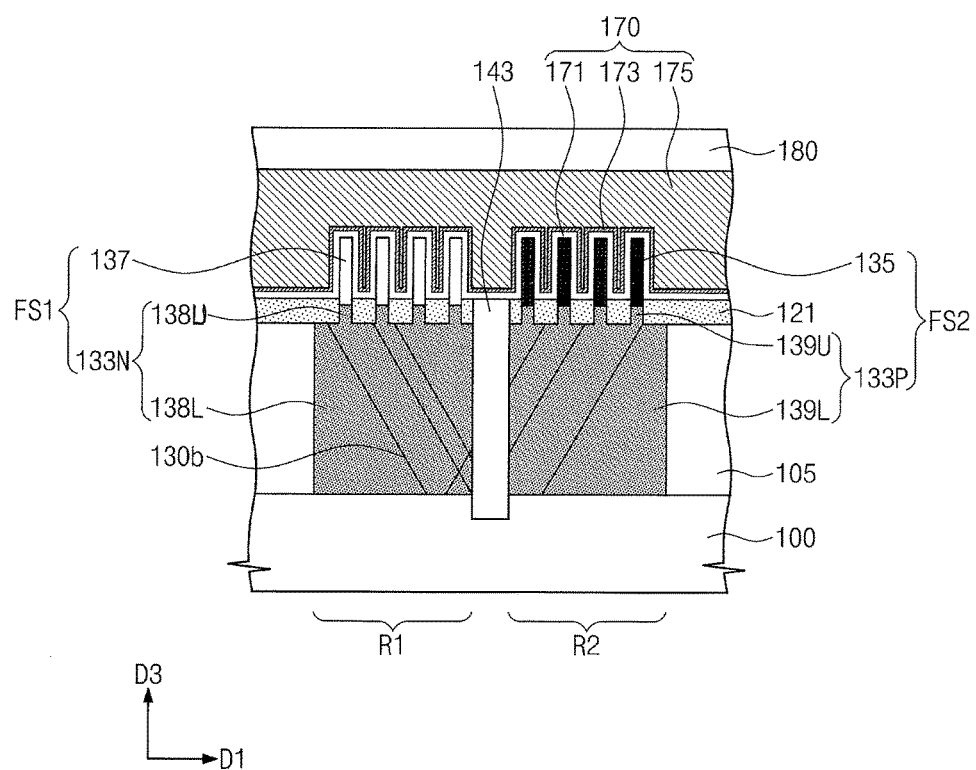

FIGS. 16 and 17 are sectional views illustrating semiconductor devices according to some further embodiments of the inventive concepts. In the following description, a previously described element may be identified by a similar or identical reference number without repeating an overlapping description thereof, for the sake of brevity.

Referring to FIGS. 16 and 17, the semiconductor substrate 100 may include the first region R1 and the second region R2. For example, the first region R1 may be a region, on which NMOS field-effect transistors are formed, and the second region R2 may be a region, on which PMOS field-effect transistors are formed.

In some embodiments, a first fin structure FS1 may be provided on the first region R1 of the semiconductor substrate 100, and a second fin structure FS2 may be provided on the second region R2 of the semiconductor substrate 100. As an example, the first fin structure FS1 and the second fin structure FS2 may be spaced apart from each other in the first direction D1.

In the semiconductor device of FIG. 16, as described above, the first fin structure FS1 may include the lower portion 138L extending in the first direction D1 and the upper portions 138U protruding from the lower portion 138L and extending in the second direction D2. The first fin structure FS1 may be formed of an epitaxial material, which is provided in the form of a unitary body and has a lattice constant different from that of the semiconductor substrate 100. In some embodiments, the semiconductor substrate 100 may be formed of silicon (Si), and the first fin structure FS1 may be formed of silicon germanium ($Si_{1-x}Ge_x$).

A second fin structure FS2 may include a buffer pattern 133P on the semiconductor substrate 100 and channel patterns 137 on the buffer pattern 133P. The buffer pattern 133P of the second fin structure FS2 may be an epitaxial layer that is provided in the form of a unitary body. For example, similar to the first fin structure FS1, the buffer pattern 133P may include a lower portion 139L extending in the first direction D1 and the upper portions 139U protruding from the lower portion 139L and extending in the second direction D2. In the second fin structure FS2, the upper portions 139U of the buffer pattern 133P may have top surfaces that are positioned at a lower level than those of the upper portions 138U of the first fin structure FS1. In addition, the top surfaces of the channel patterns 137 may be substantially coplanar with those of the upper portions 138U of the first fin structure FS1.

As an example, the buffer pattern 133P of the second fin structure FS may be formed of the same semiconductor material as the first fin structure FS1. Channel patterns 135 of the second fin structure FS2 may be provided on the upper portions 139U of the buffer pattern 133P and may be formed of a material having an energy band gap is different from that of the buffer pattern 133P. As an example, the channel patterns 135 may be formed of Si or Ge. As another example, the buffer pattern 133P may be formed of $Si_{1-x}Ge_x$, and the channel patterns 135 may be formed of $Si_{1-y}Ge_y$ (where y>x). As other example, the buffer pattern 133P and the channel patterns 135 may be formed of III-V compounds having different energy band gaps. In some embodiments, the channel patterns 135 of the second fin structure FS2 may be formed by a SEG process using top surfaces of the upper portions 139U of the buffer pattern 133P as a seed layer. An interface may exist between the upper portions 139U of the buffer pattern 133P and the channel patterns 135. In some embodiments, since the upper portions 139U of the buffer pattern 133P are formed of a substantially defect-free semiconductor material, it may be possible to reduce crystal defects in the channel patterns 135.

In the semiconductor device of FIG. 17, a first fin structure FS1 may include the first buffer pattern 133N and the first channel patterns 137, and a second fin structure FS2 may include the second buffer pattern 133P and the second channel patterns 135. Here, each of the first and second buffer patterns 133N and 133P may be formed of a single semiconductor material, as described above, and thus, it may include the lower portions 138L, 139L extending in the first direction D1 and the upper portions 138U, 139U protruding from the lower portions 138L, 139L and extending in the second direction D2.

First the first channel patterns 137 may be formed of a material having a different energy band gap from that of the first buffer pattern 133N. As an example, the first buffer pattern 133N may be formed of $Si_{1-x}Ge_x$, and the first channel patterns 137 may be formed of $Si_{1-y}Ge_y$ (where x>y). As another example, the first buffer pattern 133N may be formed of $In_{1-x}Ga_xAs$, and the first channel patterns 137 may be formed of $In_{1-y}Ga_yAs$ (where x<y). In some embodiments, the first channel patterns 137 may be epitaxial patterns that are epitaxially grown from the top surfaces of the upper portions 133U of the first buffer pattern 133N.

The second channel patterns 135 may be formed of a material having a different energy band gap from that of the second buffer pattern 133P. In addition, the second channel patterns 135 and the first channel patterns 137 may be formed of different materials. As an example, in the case where the second buffer pattern 133P is formed of $Si_{1-x}Ge_x$, the second channel patterns 135 may be formed of $Si_{1-z}Ge_z$ (where z>x). As another example, in the case where the second buffer pattern 133P is formed of $In_{1-z}Ga_zAs$, the second channel patterns 135 may be formed of $In_{1-w}Ga_wAs$ (where z>w). In some embodiments, the second channel patterns 135 may be epitaxial patterns that are epitaxially grown from the top surfaces of the upper portions 139U of the second buffer pattern 133P.

FIGS. 18A to 22A and FIGS. 18B to 22B are sectional views illustrating a method of fabricating a semiconductor device, according to some embodiments of the inventive concepts. For example, FIGS. 18A to 22A are sectional views taken along lines I-I' and II-II' of FIG. 10A, and FIGS. 18B to 22B are sectional views taken along lines III-III' and IV-IV' of FIG. 10A.

In the following description, elements described with reference to FIGS. 1A to 10A, and FIGS. 1B to 10B, and FIGS. 1C to 10C may be identified by a similar or identical reference number without repeating an overlapping description thereof, for the sake of brevity.

As described with reference to FIGS. 1 to 4, the device isolation layer 105 defining the lower trench LR and the second mask pattern 120 defining a plurality of upper trenches UR may be formed on the semiconductor substrate 100, and then, the epitaxial layer 130 may be formed to fill the lower trenches LR and the upper trenches UR. Here, the second mask pattern 120 may be formed on the device isolation layer 105, the lower trench LR may be formed to expose a portion of the semiconductor substrate 100, and the upper trenches UR may be formed to cross the lower trenches LR. The epitaxial layer 130 may include the lower portion 133L filling the lower trench LR and the upper portions 133U filling the upper trenches UR, as described with reference to FIGS. 5A, 5B, and 5C. In some embodiments, the upper portions 133U of the epitaxial layer 130 may be formed to partially fill the upper trenches UR.

Figure 18A:
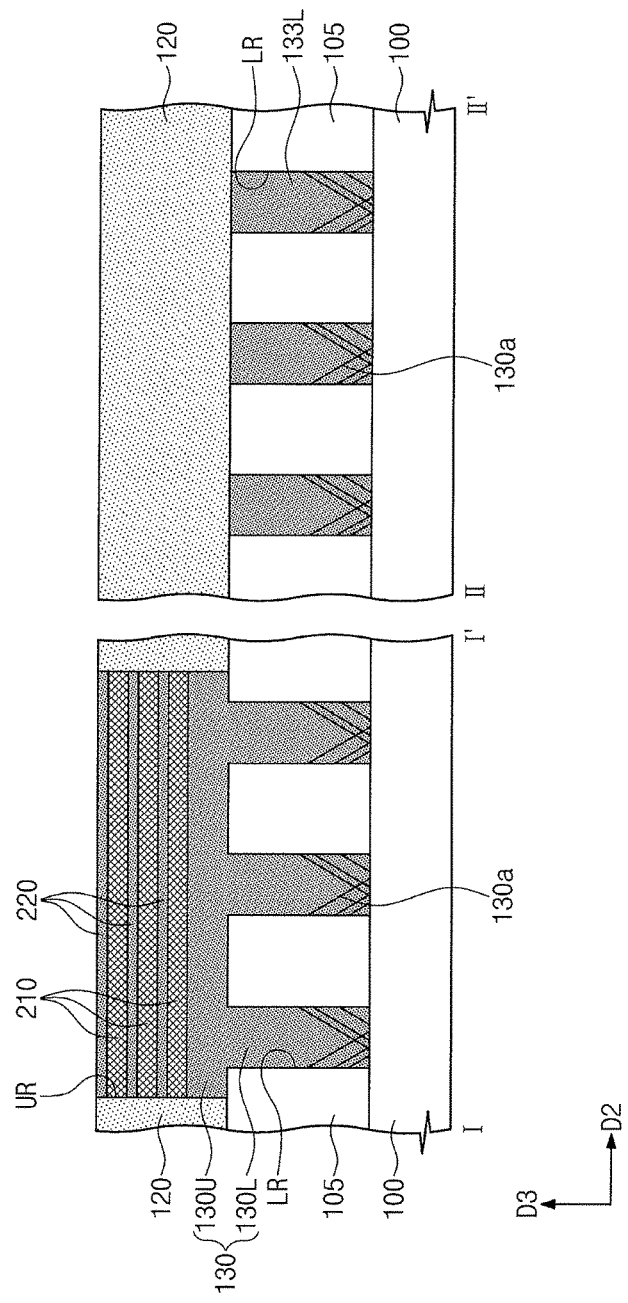
Figure 18B:
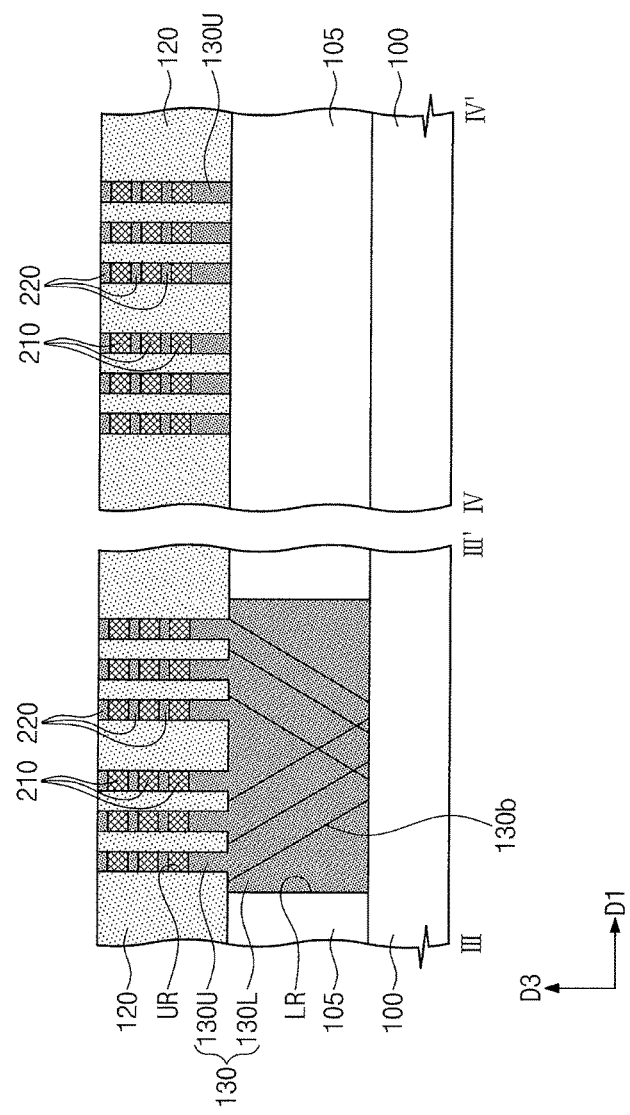

Referring to FIGS. 18A and 18B, first semiconductor layers 210 and second semiconductor layers 220 may be alternatingly and repeatedly stacked on the upper portions 133U of the epitaxial layer 130. The first and second semiconductor layers 210 and 220 may be formed of semiconductor materials having an etch selectivity with respect to each other and may be formed using a selective epitaxial growth (SEG) process. The first semiconductor layers 210 may be formed of a semiconductor material having an etch selectivity with respect to the epitaxial layer 130. The second semiconductor layers 220 may be formed of the same semiconductor material as that of the epitaxial layer 130, but in certain embodiments, the second semiconductor layers 220 may be formed of a semiconductor material different from that of the epitaxial layer 130. In some embodiments, the first semiconductor layers 210 may have a lattice constant different from that of the second semiconductor layers 220.

The first and second semiconductor layers 210 and 220 may be formed of or include, for example, at least one of Si, Ge, SiGe, or III-V compounds. The III-V compounds may be or include aluminum phosphide (AlP), gallium phosphide (GaP), indium phosphide (InP), aluminum arsenide (AlAs), gallium arsenide (GaAs), indium arsenide (InAs), aluminum antimonide (AlSb), gallium antimonide (GaSb), or indium antimonide (InSb).

As an example, the first semiconductor layers 210 may be formed of Ge, and the second semiconductor layers 220 may be formed of SiGe. As another example, the first and second semiconductor layers 210 and 220 may be formed of SiGe, but germanium concentrations of the first and second semiconductor layers 210 and 220 may be different from each other. As another example, the first semiconductor layers 210 may be formed of indium arsenic (InAs), and the second semiconductor layers 220 may be formed of gallium antimonide (GaSb).

In some embodiments, the first and second semiconductor layers 210 and 220 may be formed on the upper portions 133U of the epitaxial layer 130 having a substantially defect-free structure, thereby having an improved crystalline property.

The first and second semiconductor layers 210 and 220 may be formed to fill the upper trenches UR defined by the second mask pattern 120. Accordingly, the first and second semiconductor layers 210 and 220 may have a line-shaped structure extending in the second direction D2.

Figure 19A:
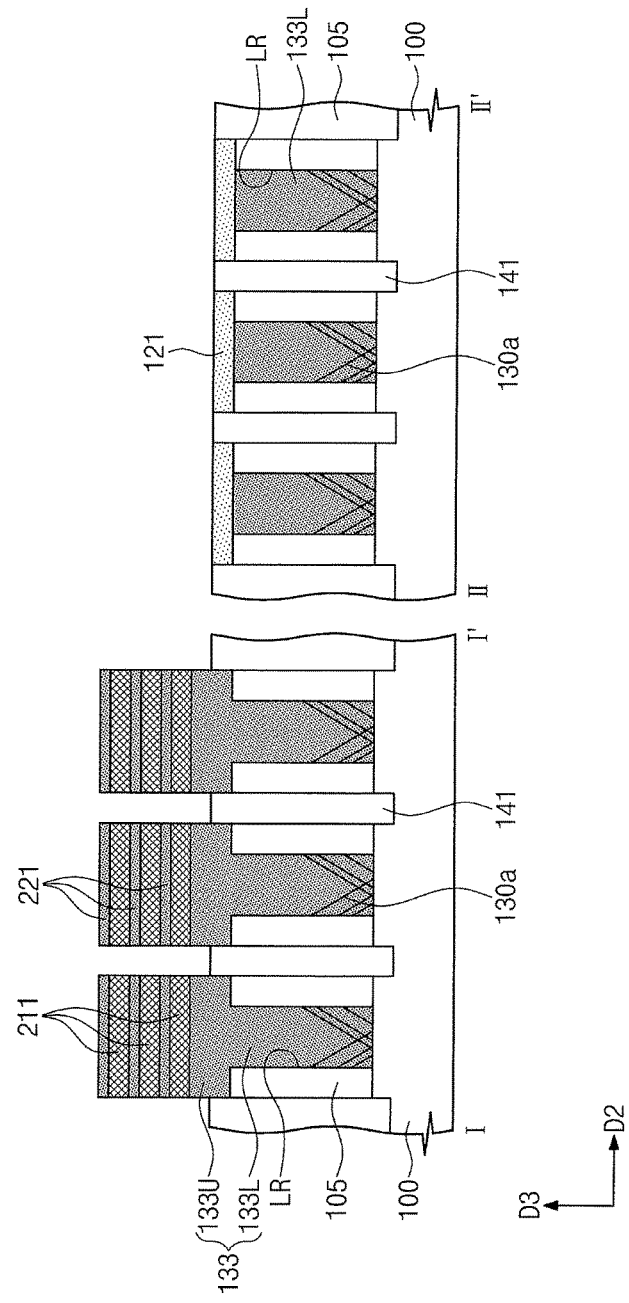
Figure 19B:
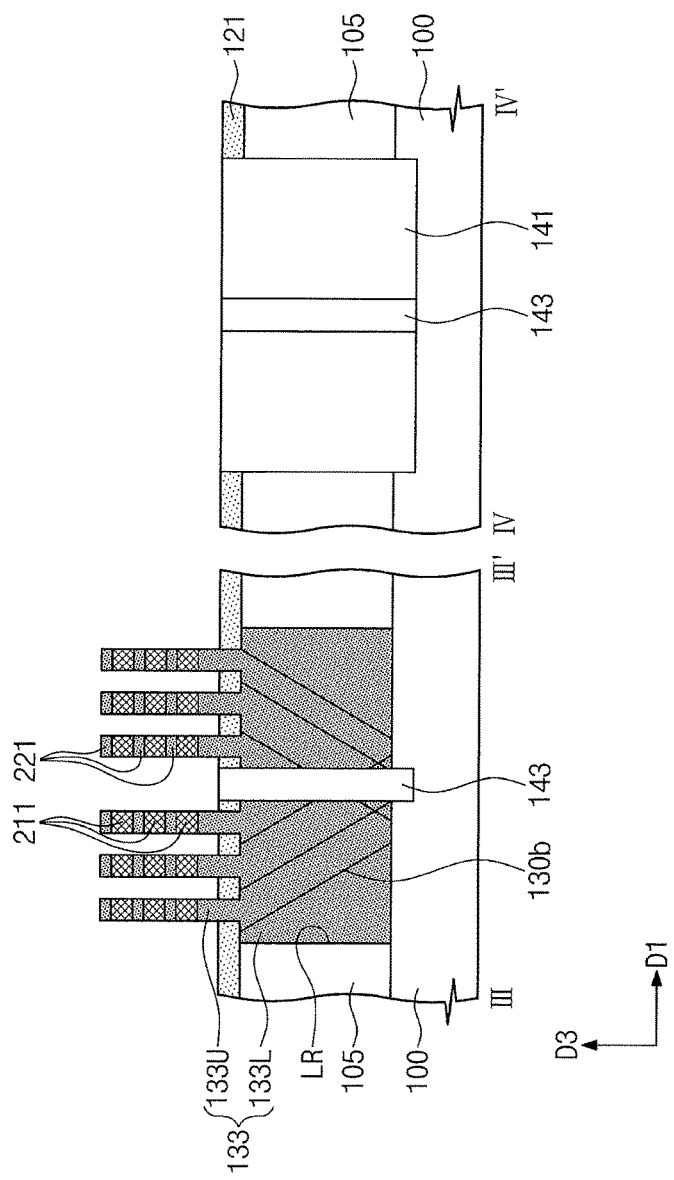

Referring to FIGS. 19A and 19B, the first insulating separation patterns 141 may be formed to extend in the first direction D1, as described with reference to FIGS. 6A, 6A, and 6C, the second insulating separation patterns 143 may be formed to extend in the second direction D2, as described with reference to FIGS. 7A, 7B, and 7C.

The first insulating separation patterns 141 may be formed to penetrate the first and second semiconductor layers 210 and 220, the upper portions 131U of the epitaxial layer 130, and the device isolation layer 105, and the second insulating separation patterns 143 may be formed to penetrate the second mask pattern 120 and the lower portions 131L of the epitaxial layer 130.

As a result of the formation of the first and second insulating separation patterns 141 and 143, a plurality of fin structures 133 and first and second semiconductor patterns 211 and 221 may be formed. The fin structures 133 may be spaced apart from each other in the first and second directions D1 and D2, and the first and second semiconductor patterns 211 and 221 may be alternatingly stacked on each of the fin structures 133. Here, each of the fin structures 133 may be provided in the form of an unitary body and may include the lower portion 133L extending in the first direction D1 and a plurality of the upper portions 133U extending in the second direction D2. The first and second semiconductor patterns 211 and 221 may be alternatingly stacked on the upper portions 133U of each of the fin structures 133.

After the formation of the fin structures 133 and the first and second semiconductor patterns 211 and 221, an etching process may be performed to recess top surfaces of the second mask pattern 120 and the first and second insulating separation patterns 141 and 143. In some embodiments, the etching process may be performed to expose sidewalls of the first and second semiconductor patterns 211 and 221 and to partially expose sidewalls of the upper portions 133U of the fin structures 133.

Figure 20A:
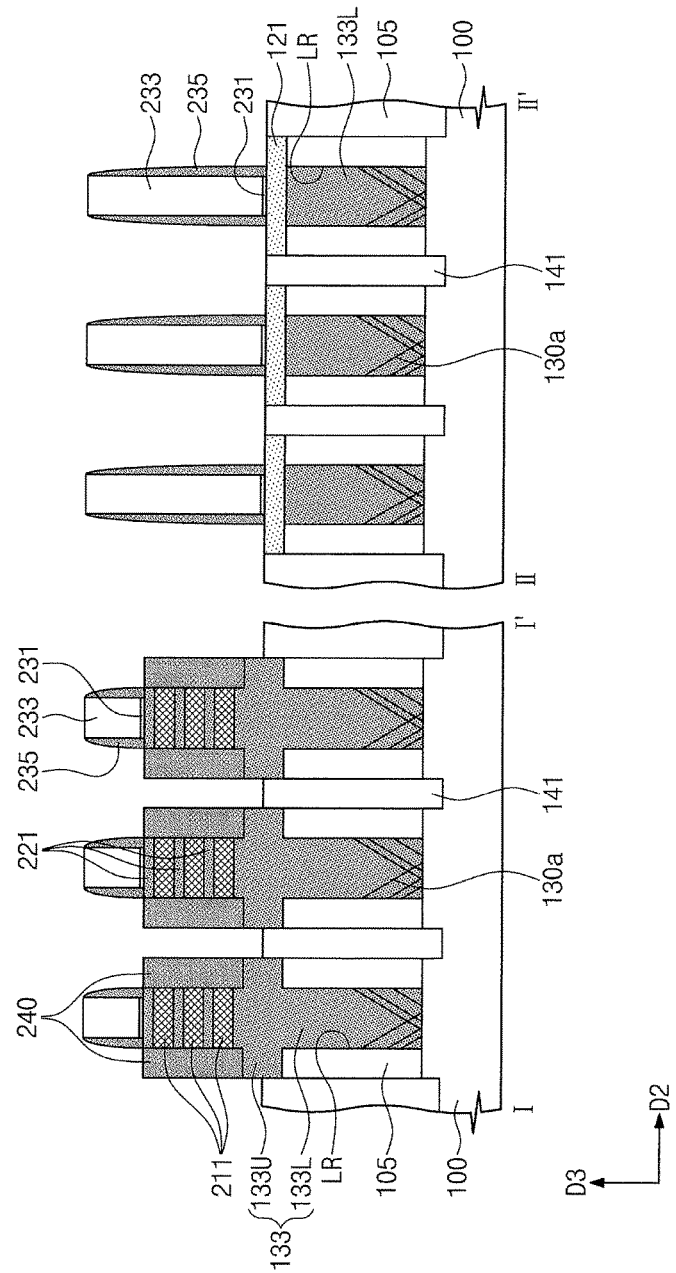
Figure 20B:
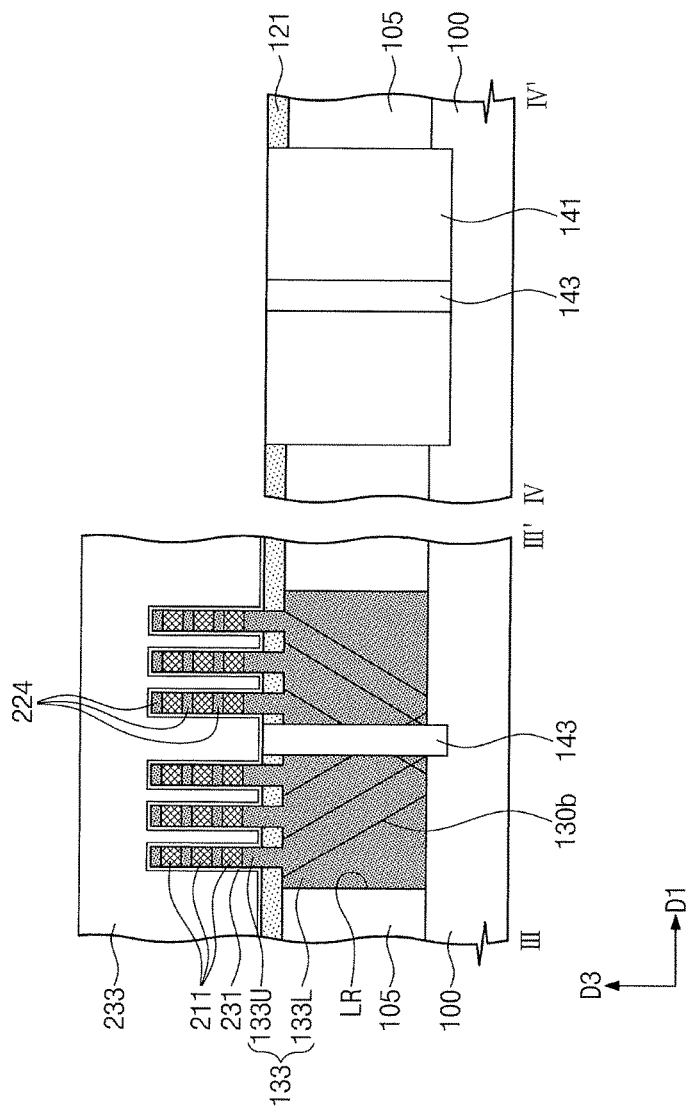

Referring to FIGS. 20A and 20B, a sacrificial gate insulating layer 231 and sacrificial gate patterns 233 may be formed to cross the first and second semiconductor patterns 211 and 221 and extend in the first direction D1, and gate spacers 235 may be formed on both sidewalls of each of the sacrificial gate patterns 233. In some embodiments, the sacrificial gate patterns 233 may be formed of a material having an etch selectivity with respect to the gate spacer 235, the second semiconductor patterns 221, and the fin structures 133. For example, the sacrificial gate patterns 233 may be formed of a doped poly-silicon layer, an undoped poly-silicon layer, a silicon germanium layer, or a silicon carbide layer.

Thereafter, recess regions may be formed by etching portions of the first and second semiconductor patterns 211 and 221, which are positioned at both sides of the sacrificial gate patterns 233, and source and drain patterns 240 may be formed in the recess regions.

The source and drain patterns 240 may be formed on the upper portions 133U of the fin structures 133 and at both sides of the sacrificial gate patterns 233 and may be epitaxial patterns that are formed using a selective epitaxial growth process. Here, the source and drain patterns 240 may be formed of a semiconductor material capable of exerting a tensile or compressive strain on the second semiconductor patterns 221.

Figure 21A:
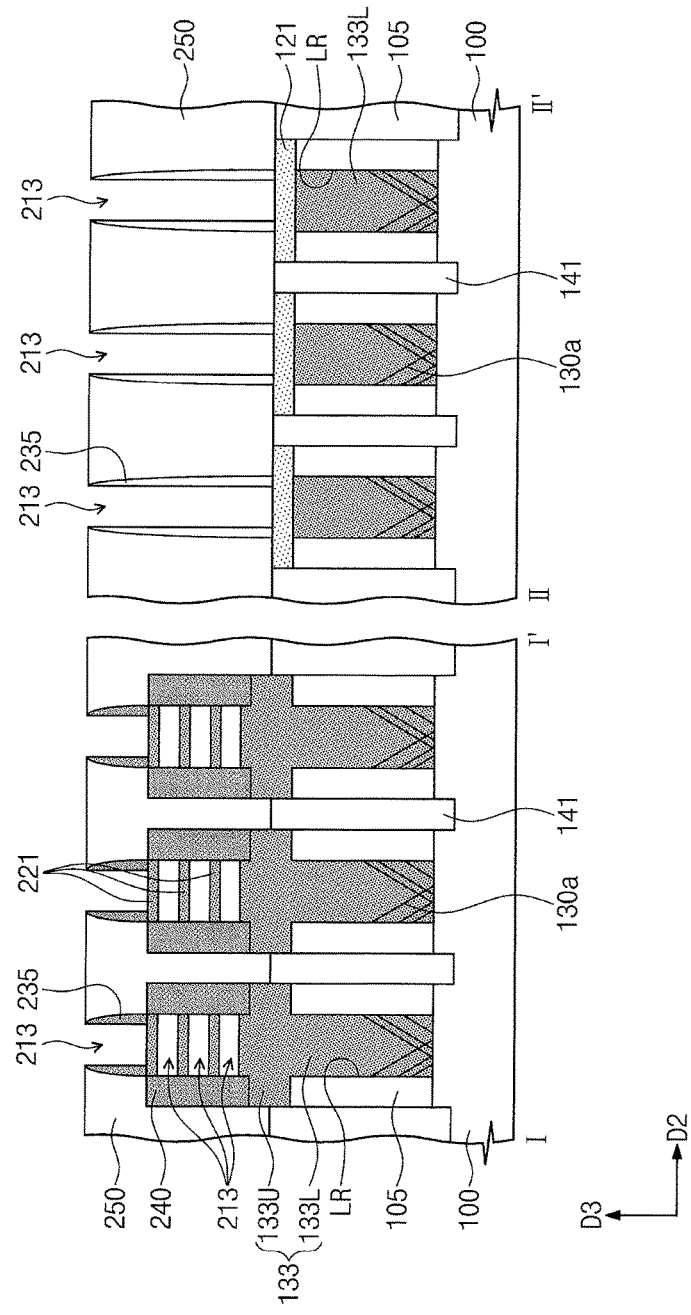
Figure 21B:
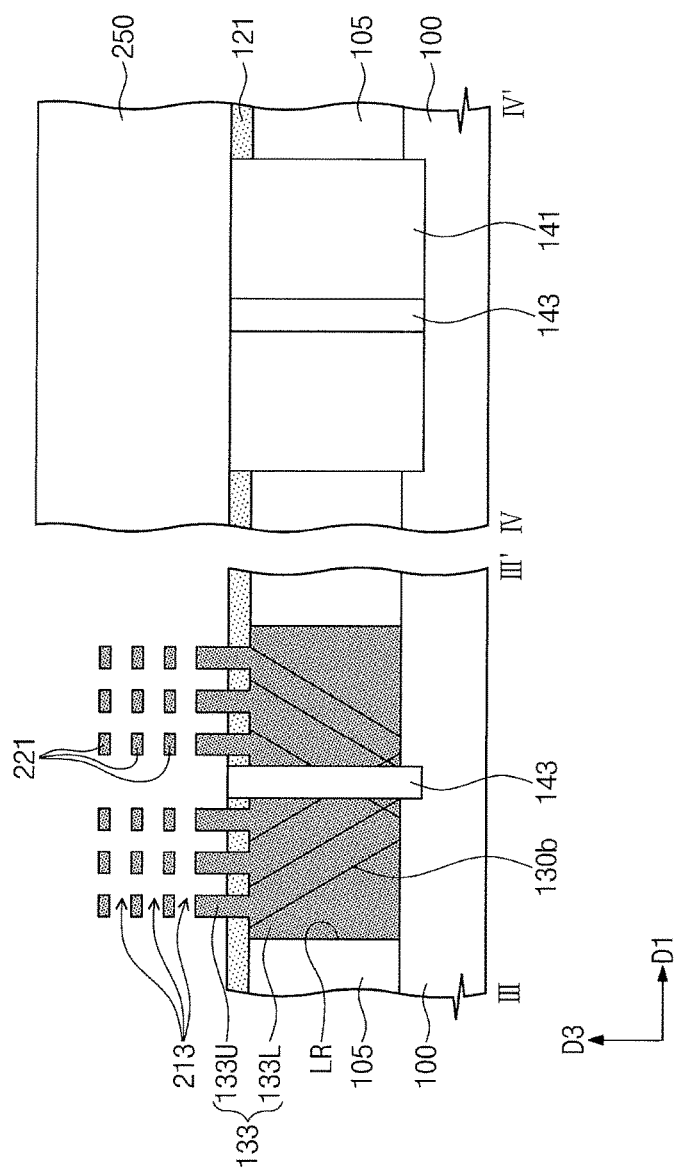

Referring to FIGS. 21A and 21B, an interlayer insulating layer 250 may be formed to cover the source and drain patterns 240 and expose top surfaces of the sacrificial gate patterns 233.

After the formation of the interlayer insulating layer 250, gate regions 213 may be formed by sequentially removing the sacrificial gate patterns 233, the sacrificial gate insulating layer 231, and the first semiconductor patterns 211.

The sacrificial gate patterns 233 may be etched in a dry or wet manner using an etch recipe having an etch selectivity with respect to the interlayer insulating layer 250 and the gate spacers 235. The sacrificial gate insulating layer 231 may also be removed during the removal of the sacrificial gate patterns 233. As a result of the removal of the sacrificial gate patterns 233, a top surface of the uppermost one of the second semiconductor patterns 221 may be exposed, and the sidewalls of the first and second semiconductor patterns 211 and 221 may be exposed.

Thereafter, the first semiconductor patterns 211 may be etched in a dry or wet manner using an etch recipe having an etch selectivity with respect to the second semiconductor patterns 221. Accordingly, the gate regions 213 may be formed between the second semiconductor patterns 221. In the case where empty spaces (e.g., the gate regions 213) are formed between the second semiconductor patterns 221, the second semiconductor patterns 221 may be formed to connect the source and drain patterns 240 and thereby to serve as bridge channels or nano-wire channels.

Figure 22A:
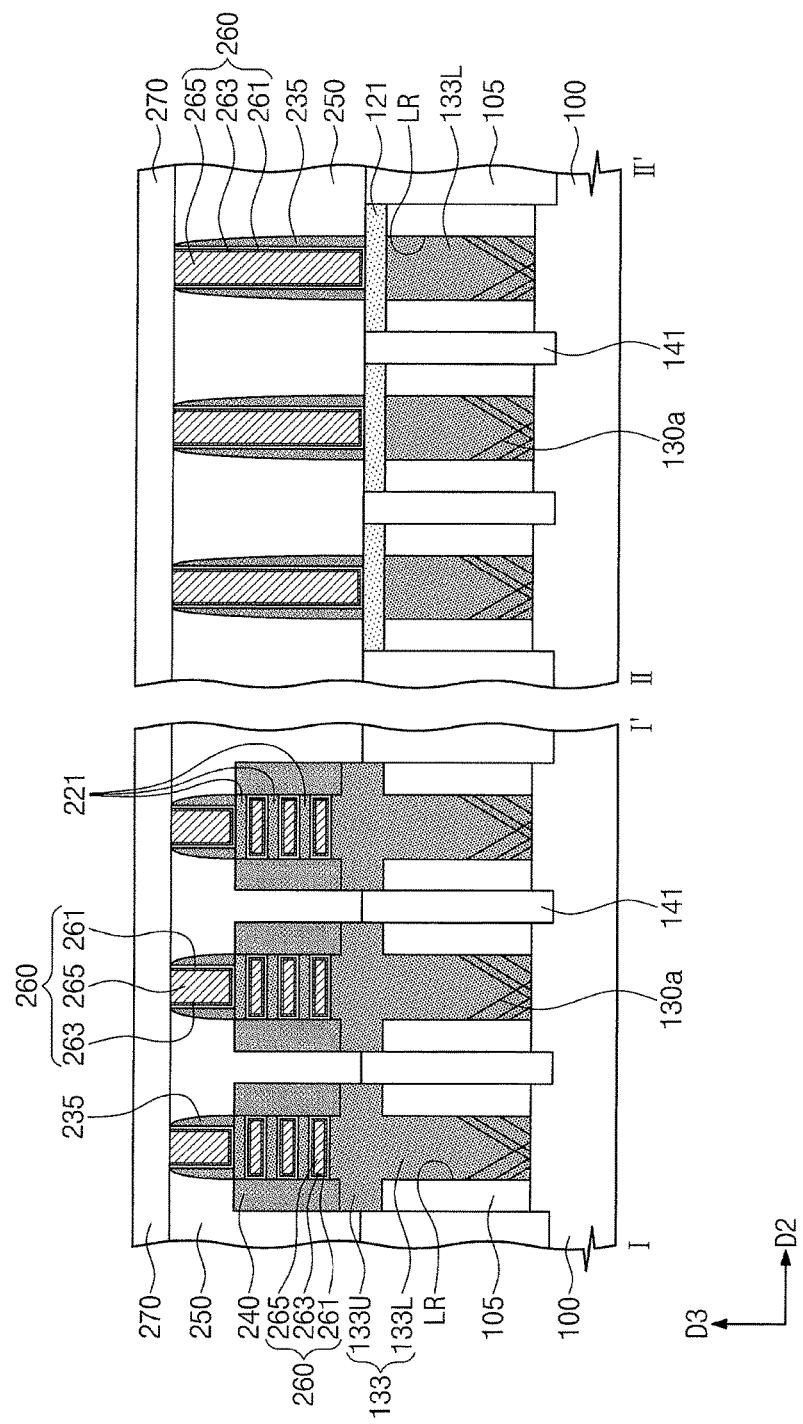
Figure 22B:
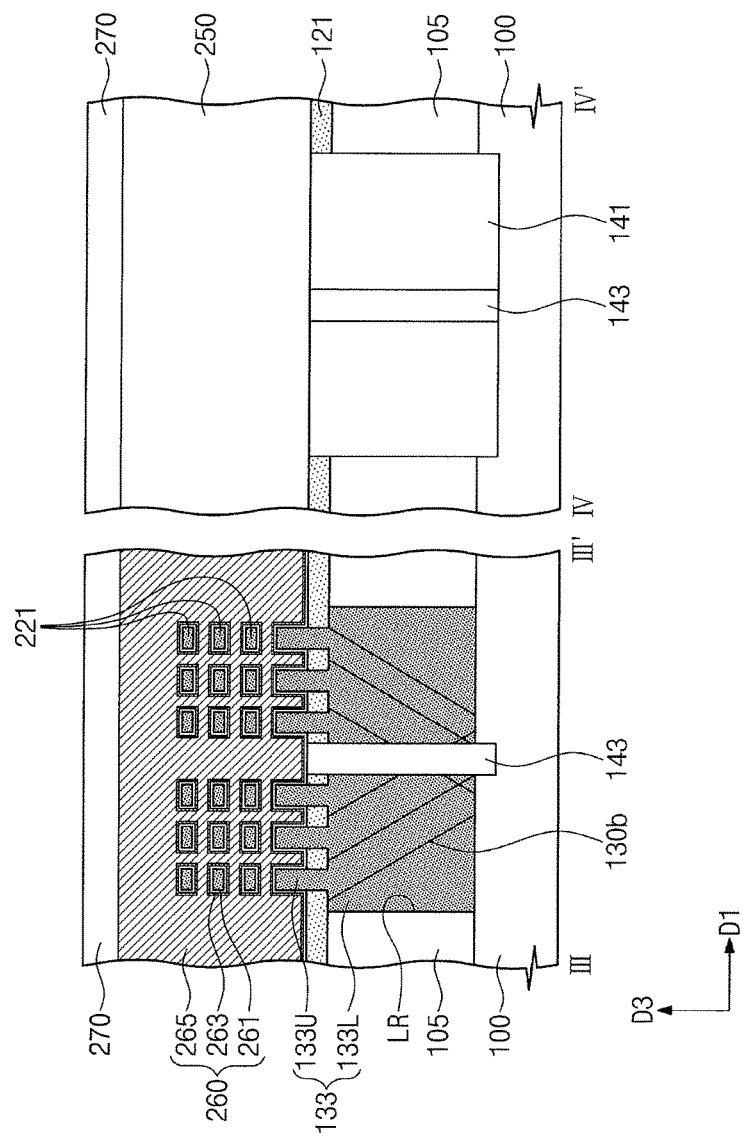

Referring to FIGS. 22A and 22B, metal gate electrodes 260 may be formed to enclose the second semiconductor patterns 221. The metal gate electrodes 260 may extend parallel to the lower portions 133L of the fin structures 133 or in the first direction D1. The metal gate electrodes 260 may include a gate dielectric layer 261, a barrier metal layer 263, and a metal layer 265, which are sequentially formed in the gate regions. The metal gate electrodes 260 may be formed to fill gap regions between the gate spacers 235 and between the second semiconductor patterns 221. In other words, the metal gate electrodes 260 may be formed to cover top, bottom, and side surfaces of the second semiconductor patterns 221.

According to some embodiments of the inventive concepts, it is possible to impede or prevent crystal defects, which are trapped in a lower portion of a fin structure, from propagating to an upper portion, during a selective epitaxial growth process for forming fin structures. Thus, the upper portion of the fin structure may be formed of a substantially defect-free semiconductor material. Accordingly, in the case where the upper portion of the fin structure is used as a channel region of a field-effect transistor, the field-effect transistor may be operated with improved electric characteristics.

While example embodiments of the inventive concepts have been particularly shown and described, it will be understood by those of ordinary skill in the art that variations in form and detail may be made therein without departing from the spirit and scope of the attached claims.

What is claimed is:

1. A field-effect transistor, comprising:
   a semiconductor substrate comprising a first semiconductor material having a first lattice constant; and
   a fin structure on the semiconductor substrate, the fin structure comprising a second semiconductor material having a second lattice constant that is different from the first lattice constant,
   wherein the fin structure comprises:
   a lower portion that is elongated in a first direction;
   a plurality of upper portions protruding from the lower portion and elongated in a second direction that is different from the first direction; and
   a gate structure crossing the plurality of upper portions.

2. The field-effect transistor of claim 1, wherein the gate structure comprises:
   a gate electrode extending in the first direction and crossing the upper portions of the fin structure; and
   a gate insulating layer disposed between the gate electrode and the upper portions of the fin structure.

3. The field-effect transistor of claim 2, further comprising source/drain regions provided in the upper portions of the fin structure on opposite sides of the gate electrode.

4. The field-effect transistor of claim 1, wherein a height of the lower portion is greater than two times a width, in the second direction, of the lower portion, and
   a length, in the first direction, of the lower portion is greater than the height of the lower portion.

5. The field-effect transistor of claim 1, wherein a width, in the first direction, of the upper portion is smaller than a width, in the second direction, of the lower portion, and
   a height of the upper portion is greater than two times the width, in the first direction, of the upper portion.

6. The field-effect transistor of claim 1, wherein the upper portions extend in the second direction past the lower portion on opposite sides of the lower portion.

7. The field-effect transistor of claim 1, wherein the lower portion comprises crystal defects, and the upper portions are substantially free of crystal defects.

8. The field-effect transistor of claim 1, wherein the fin structure is a unitary body, in which an interface is not formed between the lower portion and the upper portions.

9. The field-effect transistor of claim 1, further comprising a device isolation layer that is in contact with opposing sidewalls of the lower portion that face each other in the second direction.

10. The field-effect transistor of claim 9, further comprising a first insulating separation pattern that is in contact with opposing sidewalls of the lower portion that face each other in the first direction,
    wherein a bottom surface of the first insulating separation pattern is positioned at a lower level relative to the semiconductor substrate than a bottom surface of the fin structure.

11. The field-effect transistor of claim 1, further comprising a hard mask pattern between the upper portions of the fin structure, wherein the hard mask pattern is in contact with a top surface of the lower portion of the fin structure.

12. The field-effect transistor of claim 11, further comprising a second insulating separation pattern that is in contact with opposing sidewalls of the upper portions that face each other in the first direction.

13. A field-effect transistor, comprising:
    a semiconductor substrate comprising a first semiconductor material having a first lattice constant; and a double aspect ratio trapping structure on the semiconductor substrate, the double aspect ratio trapping structure comprising a second semiconductor material having a second lattice constant that is different from the first lattice constant, wherein the double aspect ratio trapping structure further comprises:

a lower fin portion that is elongated in a first direction;

a plurality of upper fin portions protruding from the lower fin portion and elongated in a second direction that is different from the first direction; and a gate structure crossing the plurality of upper fin portions.

14. The field-effect transistor of claim 13, wherein a height of the lower fin portion is greater than two times a width, in the second direction, of the lower fin portion.

15. The field-effect transistor of claim 14 wherein a length, in the first direction, of the lower fin portion is greater than the height of the lower fin portion.

16. The field-effect transistor of claim 13, wherein a width, in the first direction, of the upper fin portion is less than a width, in the second direction, of the lower fin portion, and a height of each of the plurality of upper fin portions is greater than two times the width, in the first direction, of each of the plurality of upper fin portions.

17. The field-effect transistor of claim 13, wherein the double aspect ratio trapping structure is a unitary body, in which an interface is not formed between the lower fin portion and the plurality of upper fin portions.

18. The field-effect transistor of claim 13, further comprising:

a device isolation layer in contact with opposing sidewalls of the lower fin portion that face each other in the second direction.

* * * * *